US006829749B2

(12) United States Patent  
Osaka et al.

(10) Patent No.: US 6,829,749 B2
(45) Date of Patent: Dec. 7, 2004

(54) DESIGN SUPPORT APPARATUS FOR CIRCUIT INCLUDING DIRECTIONAL COUPLER, DESIGN SUPPORT TOOL, METHOD OF DESIGNING CIRCUIT, AND CIRCUIT BOARD

(75) Inventors: Hideki Osaka, Oiso (JP); Toyohiko Komatsu, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 23 days.

(21) Appl. No.: 10/214,126

(22) Filed: Aug. 8, 2002

(65) Prior Publication Data

US 2003/0074638 A1 Apr. 17, 2003

(30) Foreign Application Priority Data

Aug. 8, 2001 (JP) ........................................ 2001-240077
Jul. 1, 2002 (JP) ........................................ 2002-192593

(51) Int. Cl.[7] ............................................. G06F 17/50
(52) U.S. Cl. ..................... 716/1; 716/8; 716/9; 716/10; 716/11
(58) Field of Search ................................ 716/1, 8–11

(56) References Cited

U.S. PATENT DOCUMENTS

| | | | | | |
|---|---|---|---|---|---|
| 4,281,285 A | * | 7/1981 | Bastida | ........................ | 324/643 |
| 4,917,449 A | * | 4/1990 | Granestrand | ................. | 385/41 |
| 5,787,268 A | * | 7/1998 | Sugiyama et al. | ............. | 716/11 |
| 6,441,937 B1 | * | 8/2002 | Baur et al. | ................... | 398/135 |
| 6,496,886 B1 | * | 12/2002 | Osaka et al. | ................. | 710/100 |

FOREIGN PATENT DOCUMENTS

| | | |
|---|---|---|
| JP | 7-141079 | 6/1995 |
| JP | 10-133794 | 5/1998 |
| JP | 2000-132290 | 5/2000 |
| JP | 2000-324180 | 11/2000 |
| JP | 2001-27987 | 1/2001 |
| JP | 2001-51758 | 2/2001 |
| JP | 2001-331439 | 11/2001 |
| JP | 2002-44162 | 2/2002 |

* cited by examiner

*Primary Examiner*—Vuthe Siek
(74) *Attorney, Agent, or Firm*—Mattingly, Stanger & Malur, P.C.

(57) ABSTRACT

The number of steps for preparing a layout diagram of a circuit including a coupler, which is formed by arranging a main line and a stub line in parallel with each other, is reduced. A circuit diagram editor 1902 arranges a coupler symbol 100 stored in a component symbol storage section 1904 when the coupler is arranged in preparing a circuit diagram. A layout section 1935 of a layout diagram editor 1922 layouts two wirings constituting the coupler by use of circuit diagram information and coupler information in which a coupler length and a coupler interval are defined. An object extraction section 1937 of a wiring check section 1936 extracts components and wirings from the layout diagram, and passes these to a wiring checker 1938. At this time, the coupler is passed to the wiring checker as one component that cannot be decomposed no more. Therefore, an interval between two wirings constituting the coupler is not checked.

5 Claims, 31 Drawing Sheets

FIG.3

COUPLER INFORMATION                    301

| COMPONENT NUMBER | X | X2 | |
|---|---|---|---|
| MAIN LINE START COORDINATES | P1 | (160.000, 130.000) | mm |
| STUB LINE START COORDINATES | P2 | (160.000, 130.200) | mm |
| COUPLER LENGTH | Lc | 35 | mm |
| COUPLER INTERVAL | Dc | 200 | $\mu m$ |
| TERMINATION RESISTOR COMPONENT NAME | RTT | ChipR75 | |
| TERMINATION VOLTAGE SOURCE NAME | VTT | VT18 | |
| MAIN LINE WIDTH | wm | 100 | $\mu m$ |
| STUB LINE WIDTH | ws | 100 | $\mu m$ |
| DEFORMATION | ALLOWED OR NOT-ALLOWED | | |

LAYER STRUCTURE INFORMATION                    1301

| | | | |
|---|---|---|---|
| THICKNESS 1 OF POWER SOURCE LAYER | d1 | 35 | μm |
| THICKNESS 1 OF INSULATING LAYER | d2 | 400 | μm |
| THICKNESS 1 OF WIRING LAYER | d3 | 35 | μm |
| THICKNESS 2 OF INSULATING LAYER | d4 | 400 | μm |
| THICKNESS 2 OF POWER SOURCE LAYER | d5 | 35 | μm |

FIG.14A

BOARD MATERIAL INFORMATION

| DIELECTRIC CONSTANT (RELATIVE PERMISSIVITY) | $\varepsilon r$ | 4.6 | |
|---|---|---|---|
| RESISTANCE COEFFICIENT | $\sigma$ | 5.8 | $\times 10^7 \Omega \cdot m$ |

FIG.14B

DRIVER INFORMATION

| WAVEFORM TRANSITION TIME | tr, tf | 500 | ps |
|---|---|---|---|
| OUTPUT SIGNAL LEVEL | VH | 1.8 | V |

FIG.14C

COUPLER DESIGN CONDITION INFORMATION

| MINIMUM INPUT SIGNAL LEVEL | Vsw | 250 | mV |
|---|---|---|---|
| MAXIMUM COUPLER LENGTH | Lcmax | 40 | mm |
| MAXIMUM INPUT SIGNAL WIDTH | Tw | 2 | ns |

FIG.18

WIRING RULE INFORMATION                                        1801

| VIA-TO-WIRING | ds1 | 200 | μm |
|---|---|---|---|
| VIA-TO-VIA | ds2 | 200 | μm |
| WIRING-TO-WIRING | ds3 | 200 | μm |
| COUPLER-TO-COUPLER | ds4 | 300 | μm |
| COUPLER-TO-WIRING | ds5 | 300 | μm |
| COUPLER-TO-VIA | ds6 | 300 | μm |

SECTION

DESIGN SUPPORT APPARATUS FOR CIRCUIT INCLUDING DIRECTIONAL COUPLER, DESIGN SUPPORT TOOL, METHOD OF DESIGNING CIRCUIT, AND CIRCUIT BOARD

BACKGROUND OF THE INVENTION

The present invention relates to a design support apparatus for a circuit diagram of a circuit including a directional coupler using crosstalk and for a circuit layout diagram of the same, a design support tool, a method of designing the circuit, and a circuit board.

As a technology for transferring data among a plurality of modules, a bus system used for data transfer in a computer has been known. In this bus system, the plurality of modules are connected by a common bus, and data is transferred time-divisionally among the modules by use of this bus as a data transmission line. Such a kind of bus is usually constituted by a wiring for an address signal, a wiring for a data signal, a wiring for a control signal and the like.

In the bus system, as a connection style of the bus and the module, the one in which the modules are coupled to the bus directly or through resistors and the one in which by use of crosstalk, the modules are coupled to the bus so as to be uncontacted with each other have been known. The style in which by use of the crosstalk, the modules are connected to the bus so as to be uncontacted with each other is described in Japanese Patent Application Laid-Open No. 2000-132290.

When the crosstalk is utilized, as shown in FIG. 35, for example, a driver signal line 3502 is coupled to a driver 3501, a receiver signal line 3512 is coupled to a receiver 3511, and a part 3504 of the driver signal line 3502 and a part 3514 of the receiver signal line 3512 are arranged in parallel with a constant interval. The parts in parallel with each other are a main line 3504 and a stub line 3514, and a directional coupler (coupler) 3500 is constituted by these wirings. In this coupler 3500, crosstalk is generated by a signal from the driver 3501. In the crosstalk signal, there are rear crosstalk generated in the reverse direction to a signal direction in the main line 3504 and front crosstalk generated in the same direction as the signal direction in the main line 3504. In the constitution shown in FIG. 35, the rear crosstalk is sent to the receiver 3511 via the stub line 3514, and the front crosstalk is absorbed by a termination resistor 3513 coupled to the stub line 3514. A waveform of a signal from the driver 3501 is absorbed by a termination resistor 3503 coupled to the main line 3504. Thus, unnecessary crosstalk due to the reflection of a drive signal does not occur on the stub line 3514.

In general, when crosstalk is generated between two ordinary wirings, the crosstalk becomes signal noise. Therefore, in order to prevent this crosstalk, the two wirings are made to be apart from each other with an interval more than a certain length. On the contrary, in the above described technologies, the interval between the two wirings is narrowed, and crosstalk is intentionally generated. A signal is transferred from one wiring to the other wiring without contacting them with each other.

By the way, a circuit diagram of a bus system utilizing the crosstalk was conventionally illustrated as shown in FIG. 36.

In this circuit diagram, reference numerals 611 and 612 denote functional components. Terminals D1, D2 and CLK are provided in the functional component 611, and wirings 621, 622 and 623 are provided so as to extend respectively from the terminals D1, D2 and CLK. Terminals d1, d2 and clk are provided also in the functional component 612, and wirings 641, 642 and 643 are provided so as to extend respectively from the terminals d1, d2 and clk.

In FIG. 36, portions 3601, 3602 and 3603 are respectively formed as couplers, and indirect connections of the terminals D1 and d1, the terminals D2 and d2, and the terminals CLK and clk are intended. In FIG. 36, though the coupler portions 3601, 3602 and 3603 are surrounded by the circles, the circles are merely drawn for the sake of convenience to facilitate understanding of the positions of the coupler portions. In the conventional circuit diagram, the coupler is simply treated as two different wirings, and the coupler portion is not illustrated.

When a circuit layout diagram is illustrated by use of the above described circuit diagram, the circuit layout diagram as shown in FIG. 37 is prepared in the prior art in such a manner that two wirings forming a coupler is anew selected among many wirings illustrated in the circuit diagram, and parts of the selected two wirings are arranged in parallel with a certain interval. Note that FIG. 37 illustrates a layout diagram of the coupler portions 3601, 3602 and 3603 in FIG. 36.

However, in the foregoing prior art, since the couplers are treated as a mere wiring in the circuit diagram, that is, since illustrations of the coupler are not made in the circuit diagram, two wirings forming a coupler must be anew selected among many wirings illustrated in the circuit diagram when a circuit layout diagram is drawn with reference to this circuit diagram, and moreover recognition of a correlation between the circuit diagram and the circuit layout diagram takes a lot of trouble.

Particularly, when crosstalk is used in a bus line, the number of the couplers is equal to the product of a "bus width" and the "number of functional components". For example, when the bus width is 64, and the number of the functional components is 9, the number of the couplers is as large as 512. Therefore, a lot of trouble is required to recognize the correlation between the circuit diagram and the circuit layout diagram.

Furthermore, normally, after the circuit layout diagram is once completed, intervals between many wirings are checked by use of a design support apparatus. If the contravention against a wiring rule is found out, the wiring layout is anew prepared. In this case, when a coupler 800 exists in the circuit layout diagram as shown in FIG. 37, an interval 3701 between two wirings forming the coupler 800 contravenes the wiring rule. Accordingly, when it is tried to check the interval 3701 visually without the use of the design support apparatus, labor for checking the interval 3701 is immense. Moreover, even when an interval 3702 between two wirings which do not constitute a coupler is narrow and crosstalk between these wirings occurs, there is a fear that the crosstalk cannot be found out.

In other words, the prior art has a problem that the preparation of the layout diagram of the circuit including the coupler takes a lot of trouble.

SUMMARY OF THE INVENTION

This application was made while focusing on the above described problems of the prior art, an end of this application is to provide the invention according to a design support apparatus for a circuit diagram and a layout diagram, which is capable of reducing the number of design steps for designing the layout diagram of a circuit including couplers, a system comprising the design support apparatus, a design support tool for operating a computer for a design support, and a design method of the same. This application provides also the invention according to a circuit board which is designed by the above-mentioned design support system or the design support tool.

A first design support apparatus for achieving the foregoing end is a design support apparatus for a circuit diagram which illustrates connections of components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, comprising:

symbol storage means for storing various symbols, each being previously determined for corresponding one of various components including the directional coupler;

symbol arrangement means for accepting a symbol to be arranged among various symbols stored in the symbol storage means and for accepting an arrangement position of the symbol to arrange the symbol at the arrangement position accepted; and circuit diagram information storage means for storing the symbol arranged by the symbol arrangement means and the arrangement position of the symbol.

A second design support apparatus to achieve the foregoing end is a design support apparatus for a circuit layout diagram which illustrates arrangements of components and arrangements of connections of the components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, comprising:

attribute information acceptance means for accepting coupler attribute information including at least a parallel signal line length of the directional coupler and a signal line interval thereof;

component arrangement means for arranging a part of the first signal line and a part of the second signal line, which constitute the directional coupler, as the directional coupler based at least on the coupler attribute information accepted by the attribute information acceptance means;

wiring interval check means for checking an interval between two wirings in accordance with a rule previously determined; and check object extraction means for accepting check objects checked by the wiring interval check means, for deciding whether the directional coupler exists in the accepted check objects, and for extracting the parts of the first and second signal lines constituting the directional coupler, which are checked as one directional coupler by the wiring interval check means, as well as for excepting an interval between the parts of the first and second signal lines from the check objects, when the directional coupler exists in the accepted check objects.

Here, the second design support apparatus may further comprise circuit diagram information acceptance means for accepting information of a circuit diagram, in which a plurality of components including the directional coupler are represented by symbols and connections of the components are illustrated, wherein upon acceptance of an arrangement relating to a symbol in the circuit diagram information accepted by the circuit diagram information acceptance means, the component arrangement means decides based on the coupler attribute accepted by the attribute information acceptance means whether the symbol is the directional coupler, and arranges the parts of the first and second signal lines constituting the directional coupler, when the component arrangement means decides that the symbol is the directional coupler.

A design support system to achieve the foregoing end is a design support system, comprising:

the first design support apparatus; and the second design support apparatus, wherein the second design support apparatus accepts the circuit diagram prepared by the first design support apparatus and prepares the layout diagram based on the circuit diagram.

Here, the design support system may further comprise a manufacture data preparation apparatus for preparing circuit manufacture data based on information of the layout diagram.

A design support tool to achieve the foregoing end is a design support tool for allowing a computer to execute a design support of a circuit diagram illustrating connections of various components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, the tool having symbol data stored in a first storage area of the computer, the symbol data being related to a shape of a symbol previously determined for each of the components including the directional coupler, and the tool allowing the computer to execute symbol arrangement procedures for accepting symbols to be arranged among various symbol data stored in the first storage area as well as for accepting arrangement positions of the symbols, and for arranging the symbols at the arrangement positions accepted; and circuit diagram information storage procedures for storing the symbols arranged in the symbol arrangement procedures and the arrangement positions of the symbols in a second storage area of the computer.

A second design support tool to achieve the foregoing end is a design support tool which allows a computer to execute a design support of a layout diagram illustrating arrangements of components and arrangement of connections among the components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, the tool allowing the computer to execute attribute information acceptance procedures for accepting coupler attribute information including at least a parallel signal line length of the directional coupler and a signal line interval thereof;

component arrangement procedures for arranging a part of the first signal line and a part of the second signal line, which constitute the directional coupler, as the directional coupler based at least on the coupler attribute information accepted in the attribute information acceptance procedure;

wiring interval check procedures for checking an interval between two wirings in accordance with a rule previously determined; and check object extraction procedures for accepting check objects checked by the wiring interval check procedures, for deciding whether the directional coupler exists in the accepted check objects, and for extracting the parts of the first and second signal lines constituting the directional coupler, which are checked as one directional coupler in the wiring interval check procedures, as well as for excepting an interval between the parts of the first and second signal lines from the check objects, when the directional coupler exists in the accepted check objects.

Here, in the second design support tool, the attribute information acceptance procedures may accept coupler attribute information containing identification information of the directional coupler as the coupler information; and the check object extraction procedures may decide based on the identification information of the coupler attribute information whether the directional coupler exists in the check objects.

Moreover, the second design support tool may be a tool allowing the computer to execute circuit diagram information acceptance procedures for accepting information of a circuit diagram, in which a plurality of components including the directional coupler are represented by symbols and connections of the components are illustrated, wherein upon acceptance of an arrangement relating to a symbol in the circuit diagram information accepted by the circuit diagram information acceptance procedures, it is decided in the component arrangement procedures based on the coupler attribute accepted in the attribute information acceptance procedures whether the symbol is the directional coupler, and the parts of the first and second signal lines constituting the directional coupler are arranged, when it is decided that the symbol is the directional coupler.

Moreover, in the second design support tool, when information to the effect that the parts of the first and second signal lines constituting the directional coupler must be a straight line and must not have a bent portion exists as the coupler attribute information accepted in the attribute information acceptance procedures, components other than the parts of the first and second signal lines may be moved to keep linearities of the parts of the first and second signal lines without allowing the parts of the first and second signal lines to detour other components in spite that necessity of detouring of the parts of the first and second signal lines occurs due to existence of other components in a step for arranging the parts of the first and second signal lines in the component arrangement procedures.

Moreover, in the second design support tool, when information to the effect that the parts of the first and second signal lines constituting the directional coupler are overlapped with each other in a direction from one plane of a circuit board to the other plane thereof exists as the coupler attribute information accepted in the attribute information acceptance procedures, the parts of the first and second signal lines may be arranged so as to be overlapped with each other in the direction in the component arrangement procedures.

A design method to achieve the foregoing end is a method of designing a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, comprising the steps of:

deciding a symbol, which is to be arranged, among symbols each of which is previously determined for corresponding one of various components including the directional coupler as well as deciding an arrangement position of the symbol, and arranging the symbol as the decided arrangement position, thus preparing a circuit diagram;

storing the symbol arranged in preparing the circuit diagram and the arrangement position of the symbol;

deciding coupler attribute information including at least a parallel signal line length of the directional coupler and a signal line interval thereof;

arranging parts of the first and second signal lines constituting the directional coupler as the directional coupler based at least on the coupler attribute information set in deciding the coupler attribute information when a component arranged in a layout diagram is a symbol of the directional coupler among the symbols in the circuit diagram;

checking an interval between two wirings in accordance with a rule previously determined; and accepting check objects checked as to the interval between the two wirings, deciding whether the directional coupler exists in the accepted check objects, and extracting the parts of the first and second signal lines constituting the directional coupler, which are checked as one directional coupler in checking the interval between two wirings, as well as excepting an interval between the parts of the first and second signal lines from the check objects, when the directional coupler exists in the accepted check objects.

A second design method to achieve the foregoing end is a method of designing a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver by using a computer, comprising the steps of:

storing information regarding the directive coupler, the information being defined under conditions in which the directional coupler generates the crosstalk signal; and arranging parts of the first and second signal lines in a layout diagram based on the information regarding the directional coupler upon accepting instruction of arranging the directional coupler, the parts constituting the directional coupler.

Here, the information regarding the directional coupler preferably includes identification information for identifying the directional coupler, lengths of the parts of the first and second signal lines constituting the directional coupler and an interval between the parts of the first and second signal lines constituting the directional coupler. In this case, the interval may be a maximum value of an interval with which the crosstalk signal occurs between the parts of the first and second signal lines. Note that the interval may be appropriately changed in a range not exceeding the maximum value.

A circuit board designed by the invention relating to the design support is a circuit board comprising:

a driver outputting a signal;

a first signal line coupled to the driver;

a plurality of receivers, each of which receives a crosstalk signal based on the signal from the driver;

second signal lines respectively coupled to the plurality of receivers; and a circuit board body on which the driver, the first signal line, the receivers, and the second signal lines are provided, wherein a plurality of directional couplers, each of which is constituted in such a manner that a stub line composed of a part of the second signal line and a main line composed of a part of the first signal line are arranged in parallel with each other, are provided thereon, and wherein the main line and the stub line constituting each of the directional couplers are a straight line and in parallel with each other.

Here, in the circuit board, the three or more receivers and the directional couplers of the same number as the receivers are provided, the main line and the stub line, which constitute each of the plurality of directional couplers, extend in the same direction, the three or more receivers are arranged in the direction to which the main line and the stub line extend, a spot in which an interval between the receivers adjacent to each other is longer than lengths of the main and stub lines exists and a spot in which an interval between the receivers adjacent to each other is shorter than the lengths of the main and stub lines exists, and any of the plurality of directional couplers may be arranged in at least one of the spots in which the interval is longer than the lengths of the main and stub lines.

In this case, the main and stub lines constituting the plurality of directional couplers preferably overlap in a direction from one plane of the circuit board body to the other plane thereof. In such a circuit board, it is preferred that the circuit board body has an inner layer board, the main line constituting the directional coupler is arranged on one plane of the inner layer board, and the stub line constituting the directional coupler is arranged on the other plane of the inner layer board.

BRIEF DESCRIPTION OF THE INVENTION

FIG. 3 is an explanatory view showing a structure of coupler information as the fist embodiment according to the present invention.

FIG. 14A is an explanatory view showing a structure of board material information as an embodiment according to the present invention.

FIG. 14B is an explanatory view showing a structure of driver information.

FIG. 14C is an explanatory view showing a structure of coupler design condition information.

FIG. 18 is an explanatory view showing a structure of wiring rule information as an embodiment according to the present invention.

DESCRIPTION OF THE PREFERRED EMBODIMENTS

An embodiment of a design support system according to the present invention will be described below.

Figure 19:
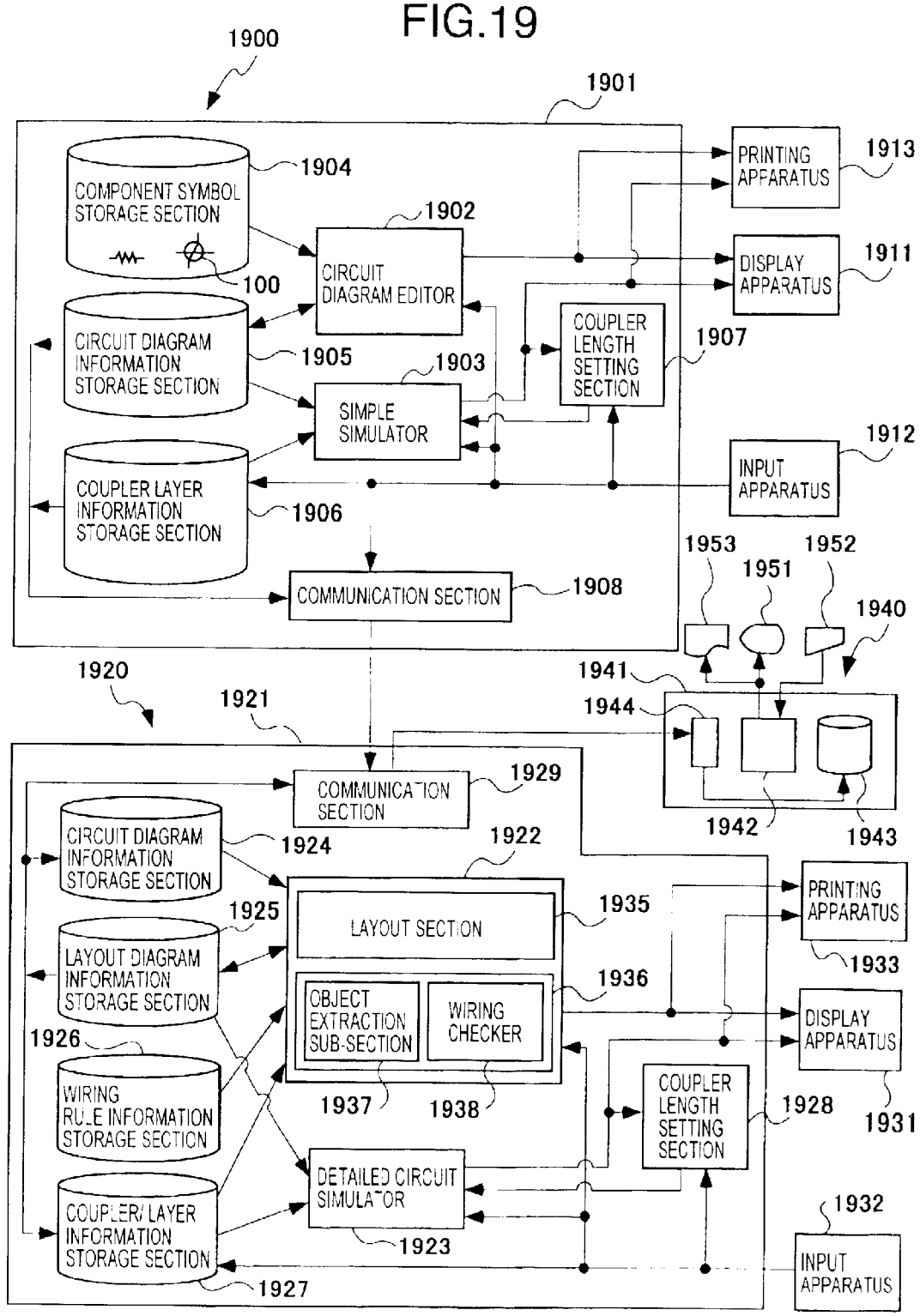
FIG. 19 is a function block diagram of a design support system as an embodiment according to the present invention.

As shown in FIG. 19, the design support system of this embodiment comprises a circuit diagram design support apparatus 1900 for supporting a design of a circuit diagram illustrating the state of connections among components; a layout diagram design support apparatus 1920 for supporting a design of a layout diagram based on the circuit diagram; and a circuit manufacture data preparation apparatus 1940 for preparing circuit manufacture data based on the layout diagram.

The circuit diagram design support apparatus 1900 includes a support main unit 1901, a display apparatus 1911, an input apparatus (acceptance means) 1912 for accepting an instruction of a designer and the like, and a printing apparatus 1913. The support main unit 1901 has a component symbol storage section 1904 which stores symbols of various components; a circuit diagram information storage section 1905 which stores circuit diagram information; a coupler/layer information storage section 1906 which stores coupler information such as a coupler length (parallel signal line length), a coupler interval (signal line interval) and the like as attributes of a coupler, and layer structure information of a board; a circuit diagram editor (symbol arrangement means, wiring arrangement means) 1902 which arranges component symbols in accordance with the contents of the instruction accepted by the input apparatus 1912 and couples the component symbols; a simple circuit simulator 1903 which executes virtually a state when a circuit illustrated by a circuit diagram, which was once prepared, is operated; a coupler length setting section (signal line length setting means) 1907 which sets the coupler length; and a communication section 1908 which receives/transmits data from/to the layout diagram design support apparatus 1920.

Furthermore, the layout diagram design support apparatus 1920 comprises a support main unit 1921, a display apparatus 1931, an input apparatus (acceptance means) 1932 for accepting an instruction of the designer and the like, and a printing apparatus 1933. The support main unit 1921 has a circuit diagram information storage section 1924 which stores circuit diagram information from the circuit diagram design support apparatus 1900; a layout diagram information storage section 1925 which stores layout diagram information; a wiring rule information storage section 1926 which stores wiring rule information for the wiring layout; a coupler/layer information storage section 1927 which stores coupler information and layer structure information; a layout diagram editor (component arrangement means, wiring interval check means) 1922 which arranges components in accordance with the content of the instruction accepted by the input apparatus 1932 and arranges wirings among the components; a detailed circuit simulator 1923 which virtually executes a state when a circuit illustrated in the layout diagram, which was once prepared, is operated; a coupler length setting section (signal line length setting means) 1928 which sets a coupler length; and a communication section (acceptance means) 1929 which receives/transmits data from/to the circuit diagram design support apparatus 1900 and a circuit manufacture data preparing apparatus 1940.

The layout diagram editor 1922 has a layout section (component arrangement means) 1935 which actually arranges the components and wirings among the components to prepare the layout diagram, and a wiring check section 1936 which checks an interval between the many wirings in the layout diagram prepared by the layout section 1935. The wiring check section 1936 has an object extraction subsection (check object extraction means) 1937 which extracts wirings to be checked, and a wiring checker (wiring interval check means) 1938 which actually checks the wiring extracted by the object extraction sub-section 1937.

The circuit manufacture data preparation apparatus 1940 has a data preparation main unit 1941, a display device 1951, an input device 1952 and a printing device 1953. The data preparation main unit 1941 has a circuit manufacture data storage section 1943 which stores circuit manufacture data, a manufacture data editor 1942 which prepares the circuit manufacture data based on the layout diagram, and a communication section 1944 for transmitting/receiving the data to/from the layout diagram design support apparatus 1920.

Figure 20:
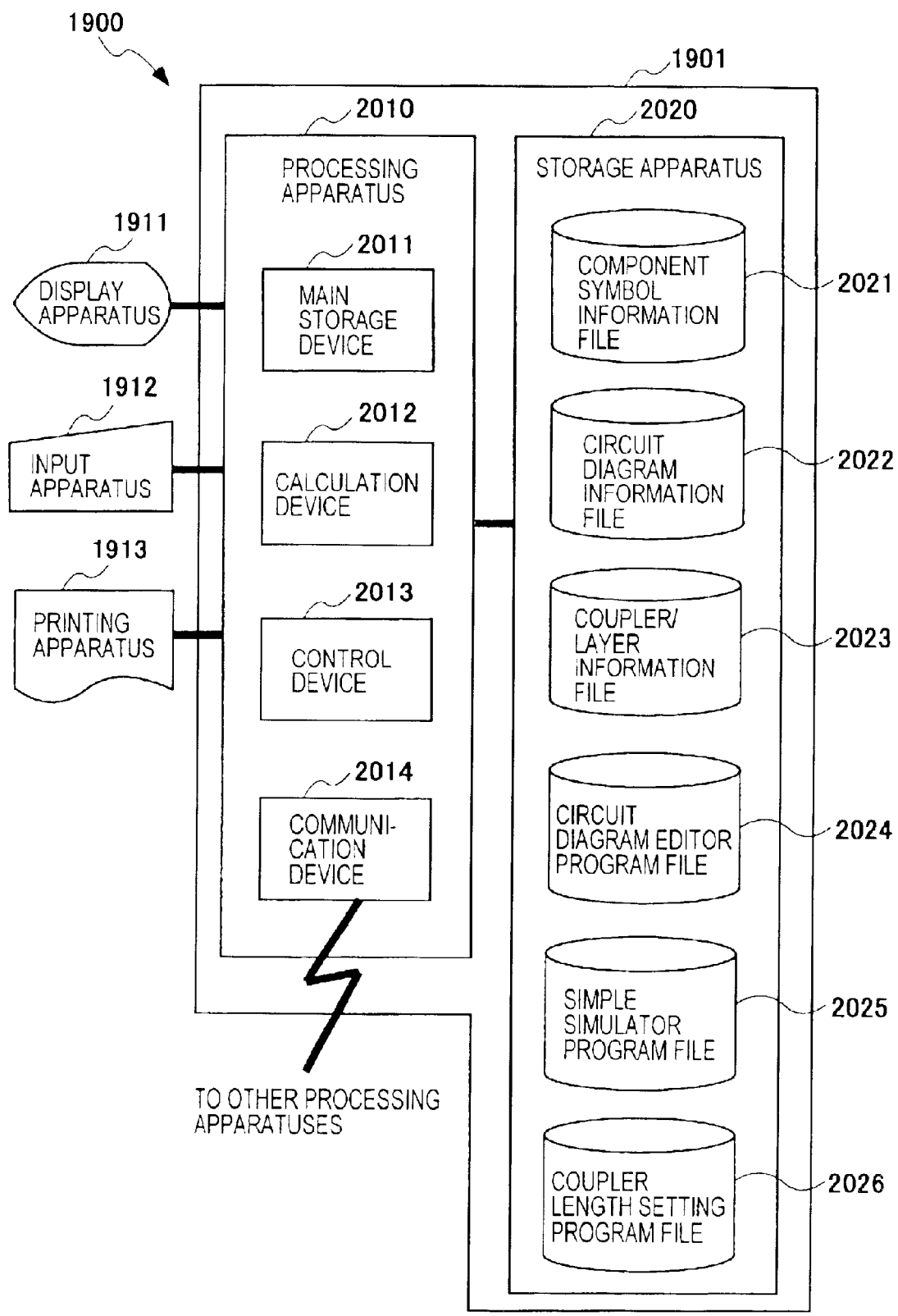
FIG. 20 is a circuit block diagram of a circuit diagram design support apparatus as an embodiment according to the present invention.

The main unit 1901 of the circuit diagram design support apparatus 1900 comprises a processing apparatus 2010 and a storage apparatus 2020 in terms of hardware, as shown in FIG. 20. The processing apparatus 2010 has a main storage device 2011 which temporarily stores various programs and various data, a calculating device 2012 which executes various programs, a control device 2013 which controls the display apparatus 1911, the input apparatus 1912, the printing apparatus 1913 and the storage apparatus 2020 in accordance with instructions of the calculating device 2012, and a communication device 2014 which transmits/receives data to/from other apparatuses. The storage apparatus 2020 has a component symbol information file 2021, a circuit diagram information file 2022, a coupler/layer information file 2023, a circuit diagram editor program file 2024, a simple simulator program file 2025 and a coupler length setting program file 2026.

The circuit diagram editor 1902 in FIG. 19 functions as a result of that the calculation device 2012 of the processing apparatus 2010 executes a circuit diagram editor program stored in the circuit diagram editor program file 2024 of the storage apparatus 2020. Similarly, the simple simulator 1902 and the coupler length setting section 1907 in FIG. 19 also function as a result of that the calculation device 2012 of the processing apparatus 2010 executes a simple simulator program stored in the simple simulator program file 2025 of the storage apparatus 2020 and a coupler length setting program stored in the coupler length setting program file 2026, respectively. Moreover, the component symbol storage section 1901, the circuit diagram information storage section 1905, the coupler/layer information storage section 1906 and the communication section 1908 are constituted so as to have a component symbol information file 2021, a circuit diagram information file 2022, a coupler/layer information file 2023, and the communication device 2014. Note that the component symbol information, the circuit diagram editor program, the simple simulator program and the coupler length setting program can be registered in the storage apparatus 2020 by installing a design support tool stored in a storage medium thereinto by the input apparatus 1912.

The main unit 1921 of the layout diagram design support apparatus 1920 and the main unit 1941 of the circuit manufacture data preparation apparatus 1940 also comprises a processing apparatus and a storage apparatus similarly to the main unit 1901 of the foregoing circuit diagram design support apparatus 1900 in terms of hardware. The layout diagram editor 1922, the detailed simulator 1923 and the coupler length setting section 1928 of the layout diagram design support apparatus 1920 shown in FIG. 19 and the manufacture editor 1942 of the circuit manufacture data preparation apparatus 1940, also shown in FIG. 19, respectively function as a result of that the calculation device of the processing apparatus executes corresponding programs stored in the storage apparatus. These programs can be registered in the storage apparatus by installing a design support tool stored in a storage medium thereinto by the input apparatus, similarly to the case of the circuit diagram design support apparatus 1900.

In the above described design support system, though the circuit diagram design support apparatus 1900 has the circuit diagram editor 1902, the simple simulator 1903 and the like, and the layout diagram design support apparatus 1920 has the layout diagram editor 1922, the detailed simulator 1923 and the like, the present invention is not limited to this. Independent apparatuses may be constituted for each of the respective functions 1902, 1903, 1907, 1922, 1923 and 1928. Alternatively, the functions may be appropriately combined into groups, and independent apparatuses may be constituted for each of the combined function groups. Moreover, herein though the coupler length setting sections 1907 and 1928 are provided both in the circuit diagram design support apparatus 1900 and in the layout diagram design support apparatus 1920, the coupler length setting section may be provided only in any one of the apparatuses 1900 and 1920.

In the component symbol storage section 1904 of the above described circuit diagram design support apparatus 1900, symbols of various elements such as resistors, capacitors and couplers are stored.

Figure 1:
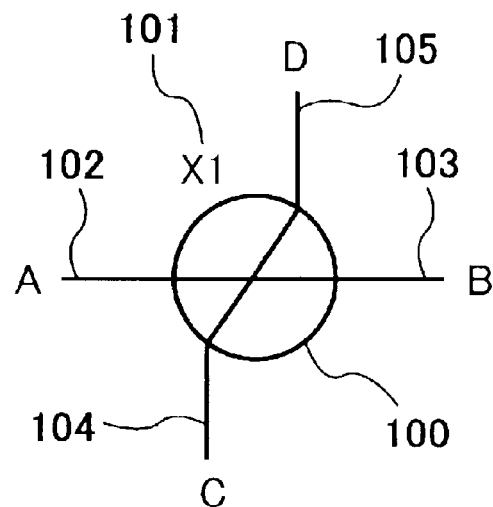
FIG. 1 is an explanatory view illustrating a coupler symbol as a first embodiment according to the present invention.

As the symbol of the coupler, there is, for example, a coupler symbol 100 shown in FIG. 1.

In FIG. 1, reference numeral 101 denotes a component number affixed to the coupler symbol 100. In the coupler symbol 100, four terminals 102, 103, 104 and 105 are provided. The terminals 102 and 103 are coupled by one wiring. The terminals 104 and 105 are also coupled by one wiring. In this coupler symbol 100, a situation is shown, in which the former wiring and the latter wiring are coupled to each other as a coupler so as to be uncontacted with each other.

Figure 2:
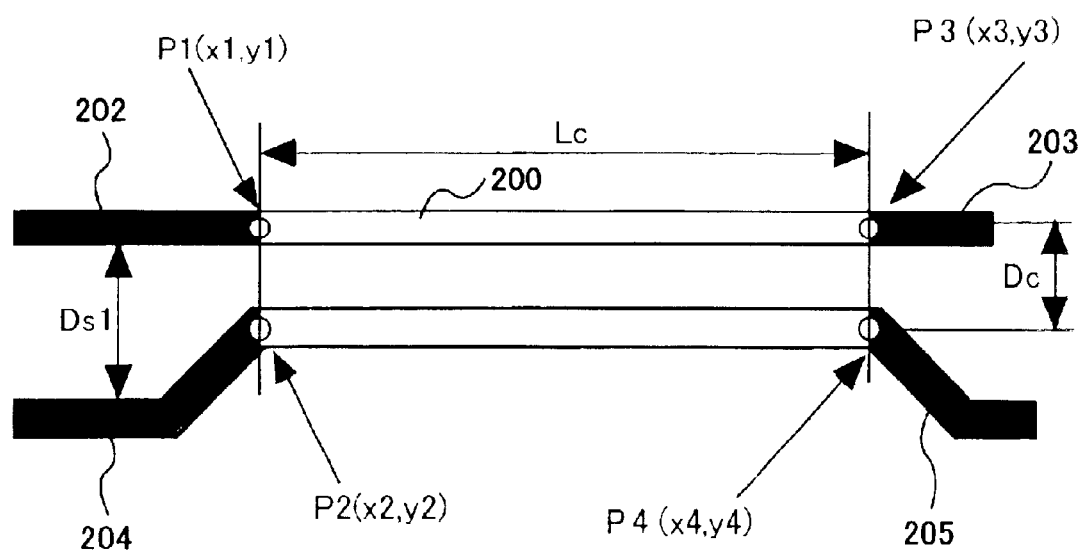
FIG. 2 is a layout diagram in which the coupler symbol of FIG. 1 is layout.

FIG. 2 is an example in which the coupler symbol 100 shown in FIG. 1 is laid out by the layout diagram editor 1922.

The coupler 200 thus laid out is two parallel wirings having a length Lc with an interval of Dc. The two wirings constituting the coupler have information indicating an origin of each wiring and an end point thereof. This information is pointers P1, P2, P3 and P4. These pointers correspond to the terminals 102, 103, 104 and 105 of FIG. 1, respectively. The wirings 202, 203, 204 and 205 are stretched out from the pointers 102, 103, 104 and 105, respectively. Although not shown in FIG. 2, the wirings 202, 203, 204 and 205 are coupled to other components or circuits.

FIG. 3 shows contents of the coupler information (coupler attribute information) 301. This coupler information 301 means information stored in the coupler/layer information storage sections 1906 and 1927 of the circuit diagram design support apparatus 1900 and the layout diagram design support apparatus 1920. The coupler information 301 is used when the layout diagram editor 1922 prepares a coupler layout diagram from the coupler symbol and when an operation of the coupler is simulated. This coupler information 301 can be registered in the coupler/layer information storage sections 1906 and 1927 via the circuit diagram editor 1902 or the layout diagram editor 1922 from the input apparatuses 1912 and 1932. The coupler information 301 can be displayed by the display apparatuses 1911 and 1931 by issuing instructions from the input apparatuses 1912 and 1932 to the circuit diagram editor 1902 and the layout diagram editor 1922, respectively.

The coupler information 301 contains items such as a component number X, main line start coordinates P1, stub line start coordinates P2, a coupler length Lc, a coupler interval Dc, a main line width wm, a stub line width ws, a termination resistor component name RTT, a termination voltage source name VTT, an indication as to whether a deformation of the coupler is allowed. The coupler information 301 exists by one for one coupler on the layout.

The component number X of the coupler information 301 corresponds to the component number 101 of the coupler symbol 100 of FIG. 1. By the component number, the circuit diagram editor 1902 and the layout diagram editor 1922 recognize the coupler as one component, and recognize that the couplers having an identical component number are identical. Therefore, the correlation between the circuit diagram and the layout diagram is made very clear, and the number of design steps of the user can be reduced.

When the layout diagram editor 1922 operates, the user arranges either the main line or the stub line, which constitutes the coupler 200, on a layout diagram screen, whereby the start coordinates P1 and P2 of the coupler information 301 are automatically set. On the contrary, when the layout diagram editor 1922 operates, the user sets the start coordinates P1 and P2 and set also the coupler length Lc and the coupler interval Dc, whereby either the main line or the stub line, which constitutes the coupler 200, is automatically arranged based on the coupler information 301. In the above described manner, the main line and the stub line, which constitute the coupler, are made to be correlated with each other by use of the coupler length Lc and the coupler interval Dc, whereby the number of steps for the wiring layout operation such as labor of the coordinate setting can be reduced.

Figure 4:
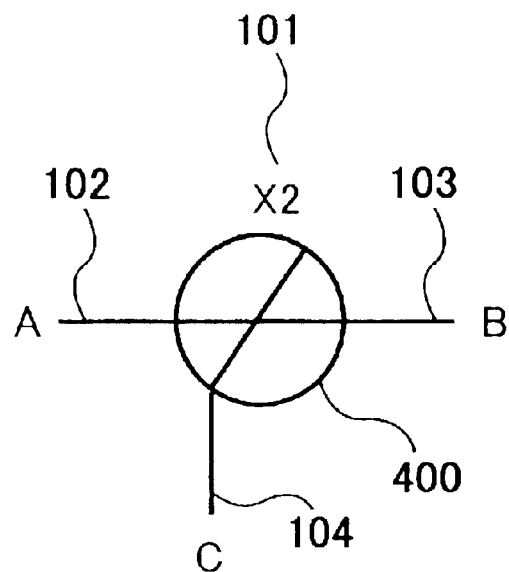
FIG. 4 is an explanatory view illustrating a coupler symbol as a second embodiment according to the present invention.

FIG. 4 is an example of another coupler symbol. The coupler symbol 400 of FIG. 4 and the coupler symbol 100 of FIG. 1 differ in that the terminal 105 in the coupler symbol 100 of FIG. 1 is omitted in the coupler symbol 400 of FIG. 4. This is because there is no real damage even if the terminal 105 is omitted for the coupler symbol, since a termination resistor is always coupled to the terminal 105 in principle.

Figure 5:
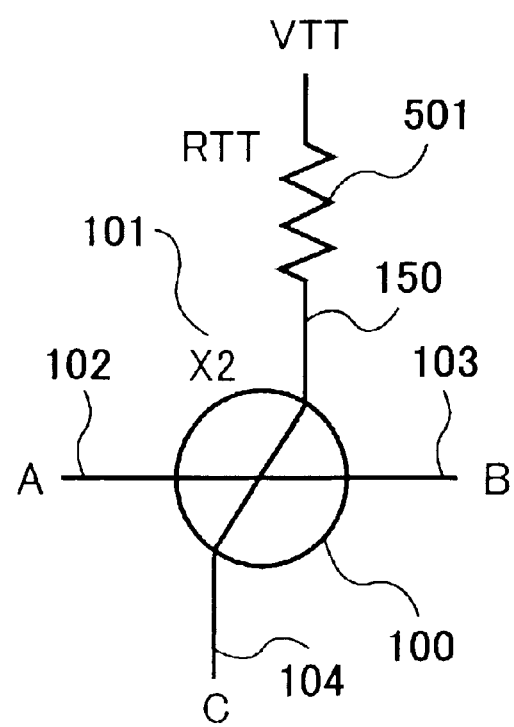
FIG. 5 is an explanatory view showing a coupler symbol as a third embodiment according to the present invention.

FIG. 5 is an example of still another coupler symbol. The coupler symbol of FIG. 5 has a structure that a termination resistor 501 is coupled to the terminal 105 of the coupler symbol 100 of FIG. 1 and a termination voltage source VTT is coupled to the termination resistor 501. Specifically, in the coupler symbol of FIG. 5, the termination resistor and the termination voltage source, which are omitted in the coupler symbol 100 in FIG. 1, are added. Note that the termination resistor name and the termination voltage source name in FIG. 3 are respectively identical to the name of the termination resistor 501 and the name of the termination voltage source VTT. As described above, when the termination resistor name and the termination voltage source name are attached to the coupler symbol, it is possible to omit the items contained in the coupler information 301, which relate to the termination resistor component name RTT and the termination voltage source name VTT. On the contrary, when the termination resistor and the termination voltage source in the coupler symbol are omitted like the coupler symbols 100 and 400 of FIGS. 1 and 4, pieces of information are needed as the coupler information 301 as shown in FIG. 3.

Figure 6:
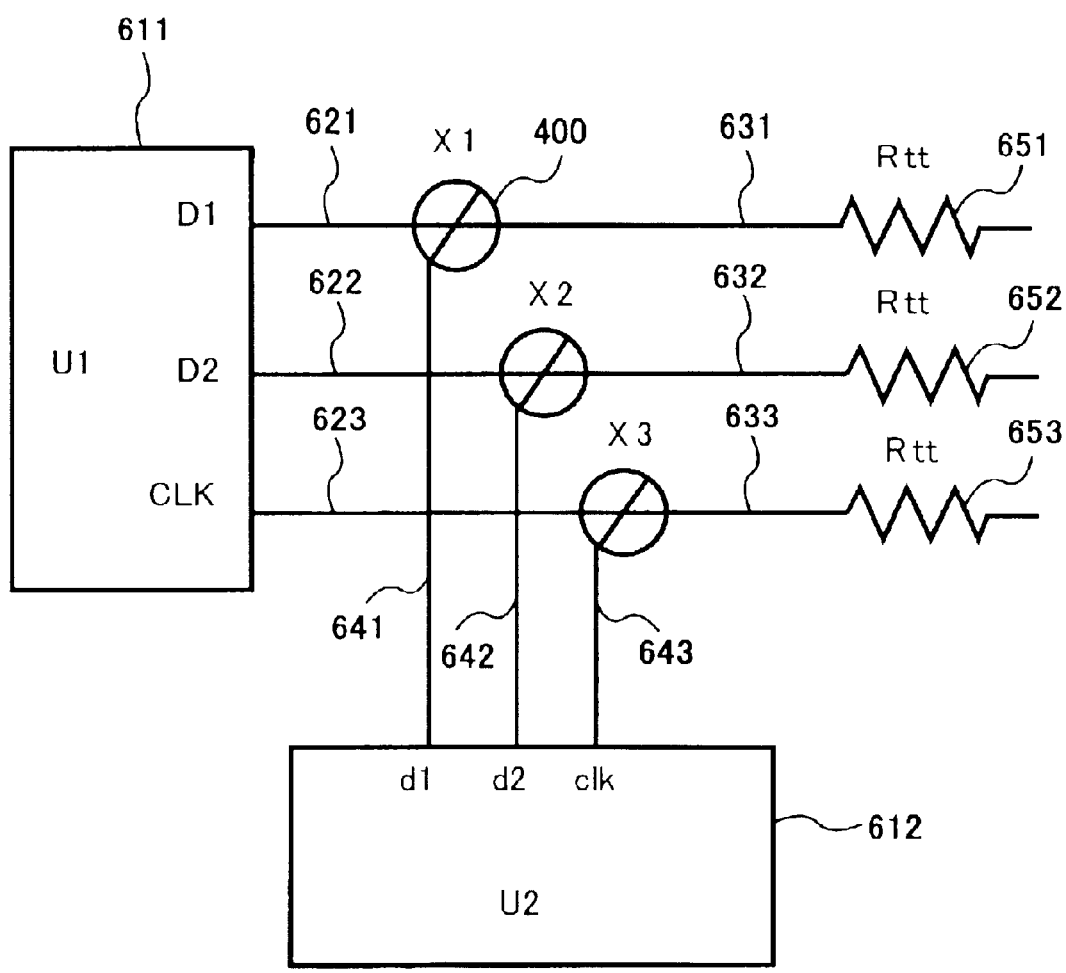
FIG. 6 is a circuit diagram as the first embodiment according to the present invention.

FIG. 6 is an example of a circuit diagram prepared by the circuit diagram editor 1902. In the circuit diagram illustrated in FIG. 6, the functional components 611 and 612 are provided. The functional component 611 has terminals D1, D2 and CLK, and the functional component 612 has terminals d1, d2 and clk. The terminals D1 and D2 are bus line terminals and the terminal CLK is a clock wiring terminal. The functional component 611 and the functional component 612 are coupled by couplers. In this circuit diagram, the couplers are represented by the coupler symbol 400 of FIG. 4. A bus line 621, a bus line 631 and a resistor 651 are coupled to the terminal D1 of the functional component 611, a bus line 622, a bus line 632 and a resistor 652 are coupled to the terminal D2 of the functional component 611. Furthermore, a bus line 623, a bus line 633 and a resistor 653 are coupled to the terminal CLK of the functional component 611. A wiring 641 is coupled to the terminal d1 of the functional component 612, and a wiring 642 is coupled to the terminal d2 of the functional component 612. Furthermore, a wiring 643 is coupled to the terminal clk of the functional component 612.

Figure 7:
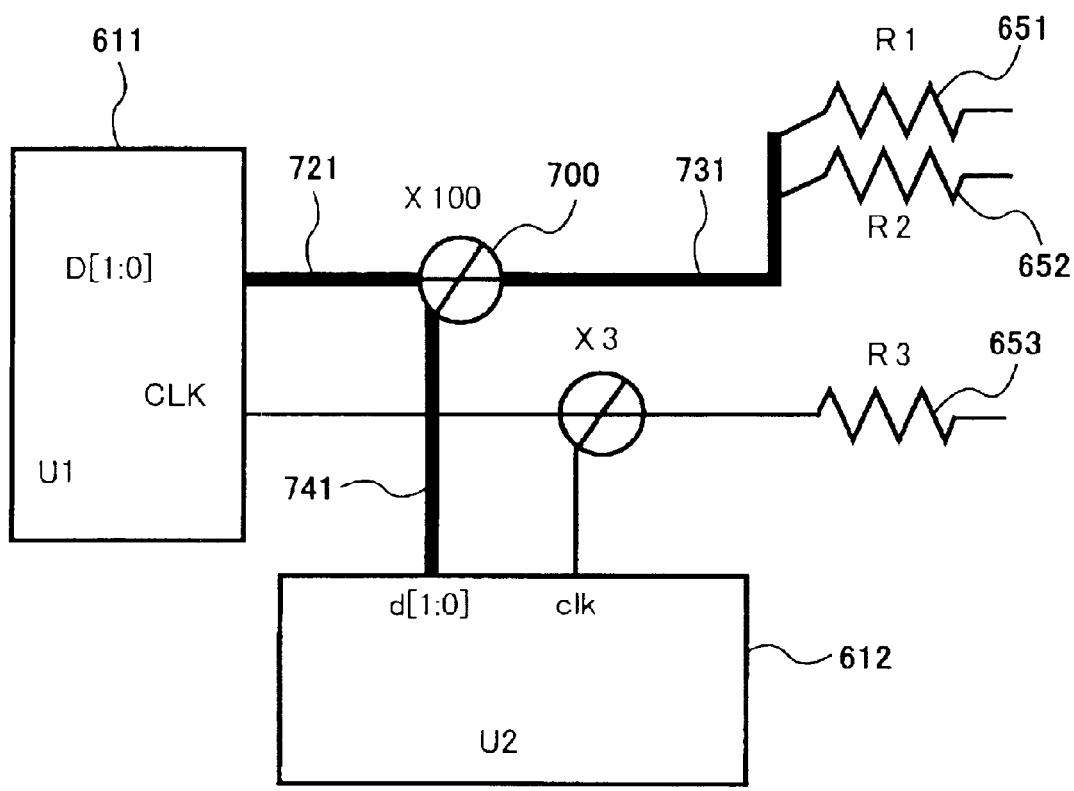
FIG. 7 is a circuit diagram as the second embodiment according to the present invention.

FIG. 7 is an example of another circuit diagram prepared by the circuit diagram editor 1902, and the circuit in FIG. 7 is equivalent to that shown in the circuit diagram of FIG. 6. In the circuit diagram of FIG. 7, the terminals D1 and D2 of the functional components 611 of FIG. 6 are represented by one bus line terminal D. The terminals d1 and d2 of the functional component 612 of FIG. 6 are represented by one bus line terminal d. Accordingly, the bus lines 621 and 622, the coupler symbols 400 and 400, the bus lines 631 and 632 and the bus lines 641 and 642 are respectively represented by one bus line 721, one coupler symbol 700, one bus line 731 and one bus line 741. Although the coupler symbol 700 of FIG. 7 is originally composed of the two couplers as described above, the specifications of the two couplers are equal. Accordingly, coupler information relating to the coupler symbol 700 is one. However, this coupler information contains information to the effect that there are two couplers having the same specifications. In this case, it is preferable that the coupler information contains information relating to the interval between the two couplers.

Figure 8:
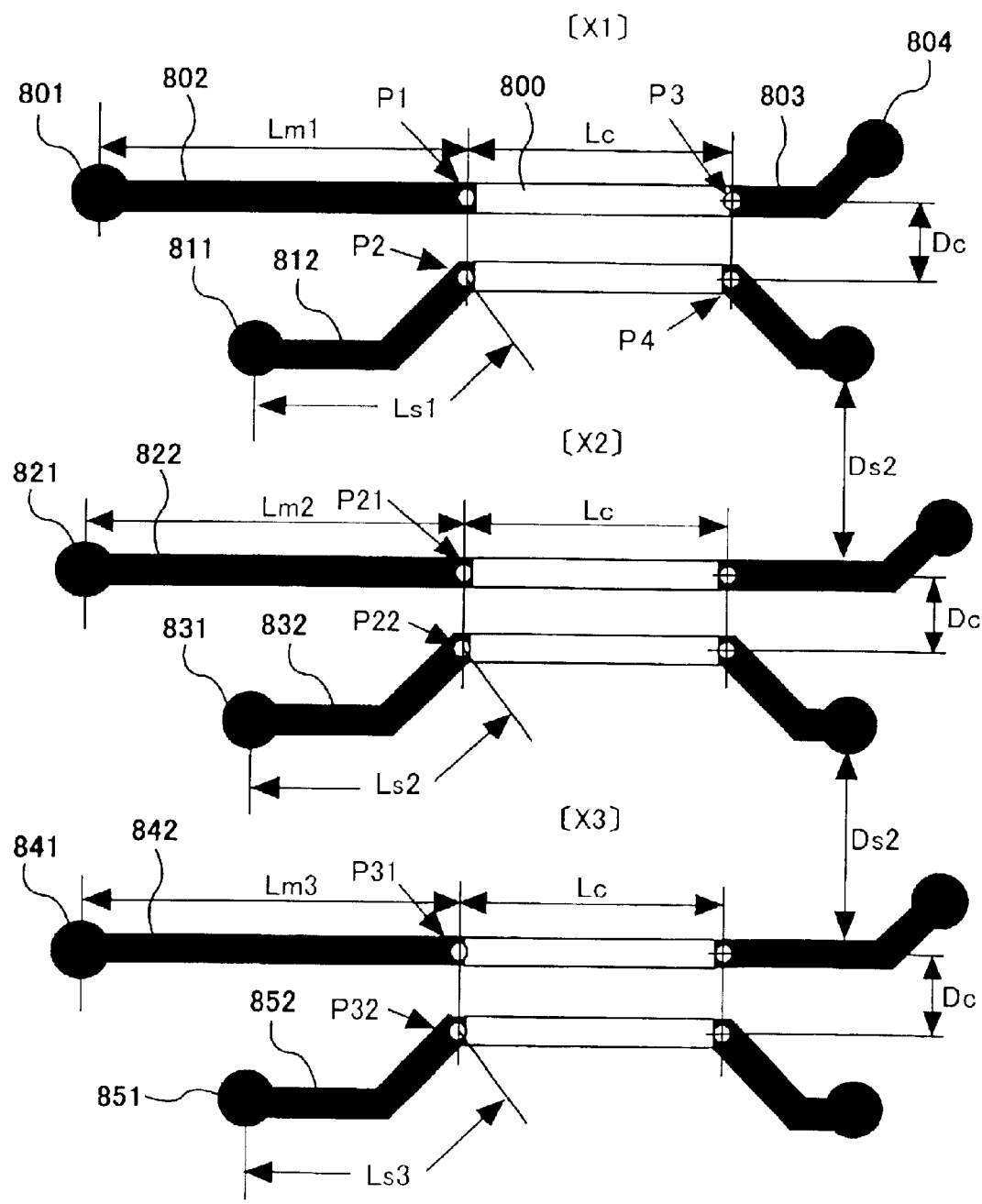
FIG. 8 is a layout diagram in which the circuit diagram of FIG. 6 or 7 is laid out.

FIG. 8 is an example of a layout diagram around the couplers prepared by the layout diagram editor 1922 based on the circuit diagram of FIG. 6 or FIG. 7.

In this layout diagram, three couplers X1, X2 and X3 represented by the coupler symbol 400 of FIG. 6 are arranged from the top to the bottom in this order. Terminals 801 and 811 correspond to the terminals D1 and d1 of the functional components 611 and 612 of FIG. 6, respectively. Terminals 821 and 831 correspond to the terminals D2 and d2 of the functional components 611 and 612 of FIG. 6, respectively. Terminals 841 and 851 correspond to the terminals CLK and clk of the functional components 611 and 612 of FIG. 6, respectively.

When the main line start coordinates P1 of the coupler X1 is given by the user during the operation of the layout diagram editor 1922, the interval Lm1 between the terminal 801 representing the terminal D1 of the functional component 611 and the coupler 800 is decided. Therefore, if the coordinates of the terminal 801 have been already decided, a bus line 802 is arranged between the terminal 801 and the coupler 800. Similarly, when the stub line start coordinates P2 of the coupler X1 is given by the user, the interval Ls1 between the terminal 811 representing the terminal d1 of the functional component 612 and the coupler 800 is decided. Therefore, a wiring 812 is arranged between the terminal 811 and the coupler 800.

The length of each bus line must be set to be equal to that of the corresponding one of other bus lines. Therefore, the layout diagram editor 1922 operates on the assumption that the intervals Lm1, Lm2 and Lm3 from the terminals 801, 821 and 841 of the functional component 611 to the corresponding couplers are equal to each other and the intervals Ls1, Ls2 and Ls3 from the terminals 811, 831 and 851 of the functional component 612 to the corresponding couplers are equal to each other. As a result, at the time when the start coordinates P1 and P2 of the coupler X1 are given by the user, the layout diagram editor 1922 decides the start coordinates P21 and P22 of the coupler X2 in relation to the terminals 821 and 831 representing the terminals D2 and d2 of the functional components 611 and 612, and decides the start coordinates P31 and P32 of the coupler X3 in relation to the terminals 841 and 851 representing the terminals CLK and clk of the functional components 611 and 612. Accordingly, after the main line start coordinates P1 and P2 of the coupler X1 are given by the user, each of the bus lines 802, 812, 822, 832, 842 and 852 is automatically arranged only by instructing the arrangements of the bus lines, without giving the wiring terminal coordinates and the like separately.

Since with respect to the bus line 803 on the terminal side of each coupler, the interval from the coupler 800 to the terminal 804 of the termination resistor and the like must be equal to each other, the layout diagram editor 1922 arranges the wirings similarly to the foregoing arrangements of the bus lines.

Accordingly, in this embodiment, it is possible to simply make the lengths of the wirings constituting the bus lines even. Thus, skew between the functional components can be suppressed, and compatibleness of a high speed of the actual printed circuit board with a reduction of the number of the design steps can be achieved.

By the way, it is often difficult to make the lengths of the bus lines accurately even because of existence of other components in terms of the wiring layout. Therefore, for the layout diagram editor 1922, an allowable range is provided as to the length of each bus line, and a wiring rule, for example, in which the length of each bus line should be within 20% of the wiring length Lm1 is settled. Then, when the length of a certain bus line 802 cannot be made equal to those of another bus line 822, the layout diagram editor 1922 shortens or lengthens the length of the bus line 822 within this allowable range.

Next, procedures to change the coupler length of the coupler 200 will be described.

Figure 9:
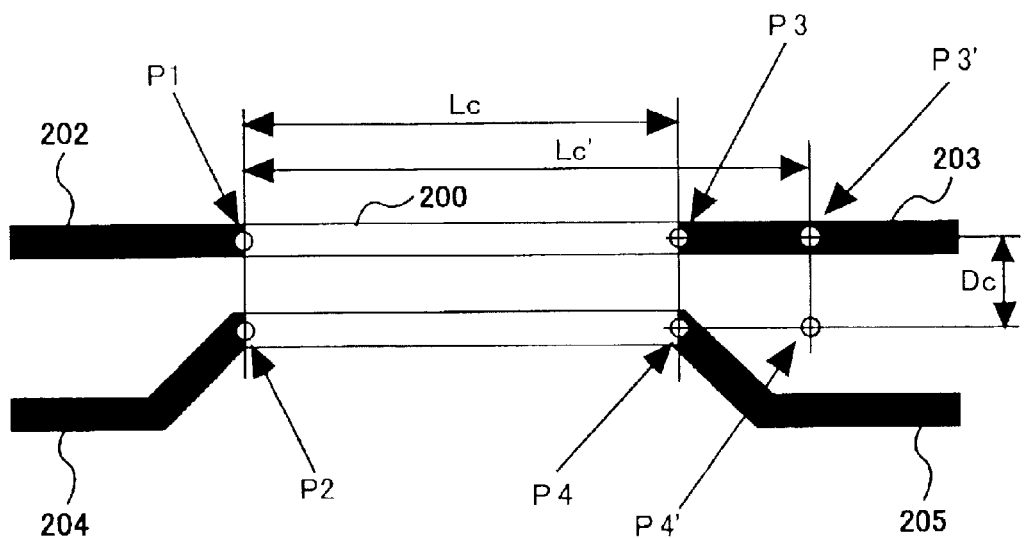
FIG. 9 is an explanatory view illustrating a method of expanding a coupler length as an embodiment according to the present invention.

First, procedures to shorten the coupler length from Lc' to Lc will be described based on FIG. 9.

When the coupler length is shortened, the coordinates P3 and P4 are moved so as to match the coordinates P3 and P4 with the coupler length while unchanging the coordinates P1 and P2 on the functional component side. This is because the positions of the coordinates P1 and P2 affect on the wiring length between the functional component and the coupler, and a time of a signal propagation between the functional components varies with the movement of the coordinates P1 and P2.

The coordinates P3 moves on the extended line of the wiring 203. Furthermore, to secure the coupler interval Dc, the coordinates P4 moves so that the line P2–P4 is in parallel with the line P1–P3. After the movements of the coordinates P3 and P4, the start coordinates of the wiring 203 is moved from the P3' to P3, and the wiring 203 is arranged anew. The start coordinates of the wiring 205 is moved from P4' to P4, and the wiring 205 is arranged anew.

Figure 10:
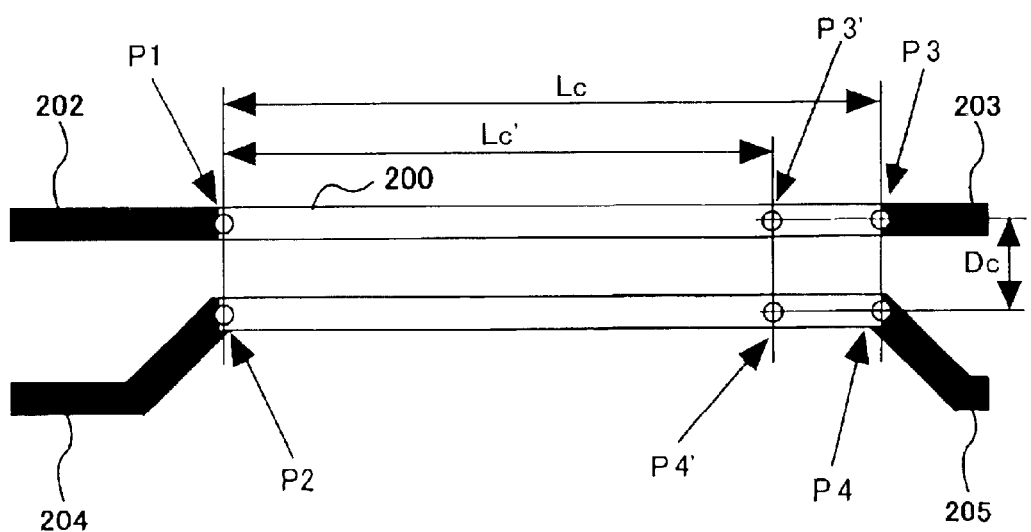
FIG. 10 is an explanatory view illustrating a method of reducing the coupler length as an embodiment according to the present invention.

Next, procedures to lengthen the coupler length from Lc' to Lc will be described based on FIG. 10.

When the coupler length Lc' is lengthened, the coordinates of P1 and P2 closer to the functional components are unchanged, the coordinates P3 and P4 are moved so as to match the coordinates P3 and P4 with the coupler length Lc, similarly to the foregoing case where the coupler length Lc' is shortened.

The coordinates P3 moves on the wiring 203. Furthermore, to secure the coupler interval Dc, the coordinates P4 moves so that the line P2–P4 is in parallel with the line P1–P3. After the movements of the coordinates P3 and P4, the start coordinates of the wiring 203 is moved from P3' to P3, and the wiring 203 is arranged anew. The start coordinates of the wiring 205 is moved from P4' to P4, and the wiring 205 is arranged anew.

Figure 11:
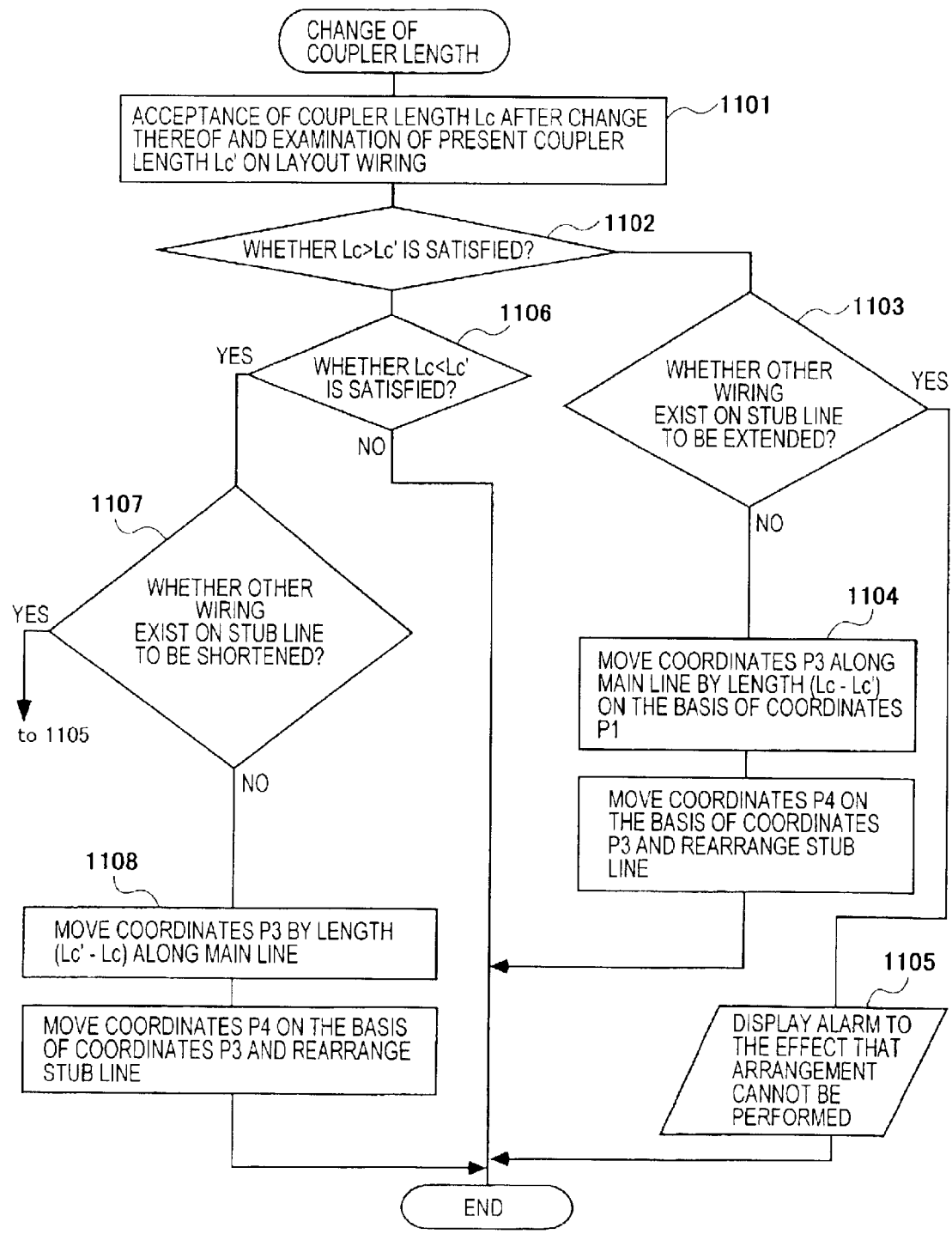
FIG. 11 is a flowchart showing processing procedures for changing the coupler length as an embodiment according to the present invention.

Next, an operation of the layout diagram editor 1922 when the coupler length is changed will be described in accordance with the flowchart of FIG. 11.

Upon receipt of the coupler length Lc thus changed, the layout diagram editor 1922 provisionally registers the changed coupler length Lc in the coupler/layer information storage section 1927, and checks the coupler length Lc' that is illustrated in the present layout diagram (Step 1101). When the layout diagram editor 1922 checks the present coupler length Lc', the layout diagram editor 1922 checks the start coordinates P1 and terminal coordinates P3 of the object coupler, or extracts the coupler length Lc', which has been already registered, as the coupler information 301 of the coupler/layer information storage section 1927.

Subsequently, the layout diagram editor 1922 decides whether the changed coupler length Lc' is longer than the present coupler length Lc (Step 1102). When it is decided that the changed coupler length Lc' is longer than the present coupler length Lc, the layout diagram editor 1922 decides whether another wiring and the like exist on the stub line to be extended (Step 1103). When the layout diagram editor 1922 decides that another wiring and the like do not exist on the stub line to be extended, the layout diagram editor 1922 moves the terminal coordinates P3 of the main line along the main line by (Lc–Lc') on the basis of the start coordinates P1 of the main line. Subsequently, the layout diagram editor 1922 moves the terminal coordinates P4 of the stub line on the basis of the terminal coordinates P3 of the main line, and rewires the stub line (Step 1104). Thereafter, the layout diagram editor 1922 formally registers the changed coupler length Lc, which has been provisionally registered, in the coupler/layer information storage section 1927. Furthermore, in Step 1103, when the layout diagram editor 1922 decides that another wiring and the like exist on the stub line to be extended, the layout diagram editor 1922 allows the display apparatus 1931 to display an alarm to the effect that the arrangement cannot be performed (Step 1105). Thereafter, the layout diagram editor 1922 erases the changed coupler length Lc which has been provisionally registered in the coupler/layer information storage section 1927.

In Step 1102, when the layout diagram editor 1922 decides that the changed coupler length Lc' is not longer than the present coupler length Lc, the layout diagram editor 1922 decides whether or not the changed coupler length Lc' is shorter than the present coupler length Lc (Step 1106). When the layout diagram editor 1922 decides that the changed coupler length Lc' is not shorter than the present coupler length Lc, in other words, when the layout diagram editor 1922 decides that the changed coupler length Lc' is equal to the present coupler length Lc, the layout diagram editor 1922 immediately finishes the coupler length change processing routine. Moreover, when the layout diagram editor 1922 decides that the changed coupler length Lc' is shorter than the present coupler length Lc, the layout diagram editor 1922 decides whether another wiring and the like exist on the stub line to be shortened (Step 1107). When the layout diagram editor 1922 decides that another wiring and the like do not exist on the stub line to be shortened, the layout diagram editor 1922 moves the terminal coordinates P3 of the main line along the main line by (Lc'–Lc) on the basis of the start coordinates P1 of the main line, as described above. Subsequently, the layout diagram editor 1922 moves the terminal coordinates P4 of the stub line on the basis of the terminal coordinates P3 of the main line, and rewires the stub line (Step 1108). Moreover, in Step 1107, when the layout diagram editor 1922 decides that another wiring and the like exist on the stub line to be shortened, the layout diagram editor 1922 allows the display apparatus 1931 to display an alarm to the effect that the arrangement cannot be performed (Step 1105).

As described above, when the coupler length is changed, only by giving the changed coupler length, the main line and the stub line, which constitute the coupler, are arranged with the changed coupler length. Accordingly, the number of operation steps for correcting the wiring layout can be reduced.

Next, the method for determining the coupler length will be described.

Figures 12, 13:
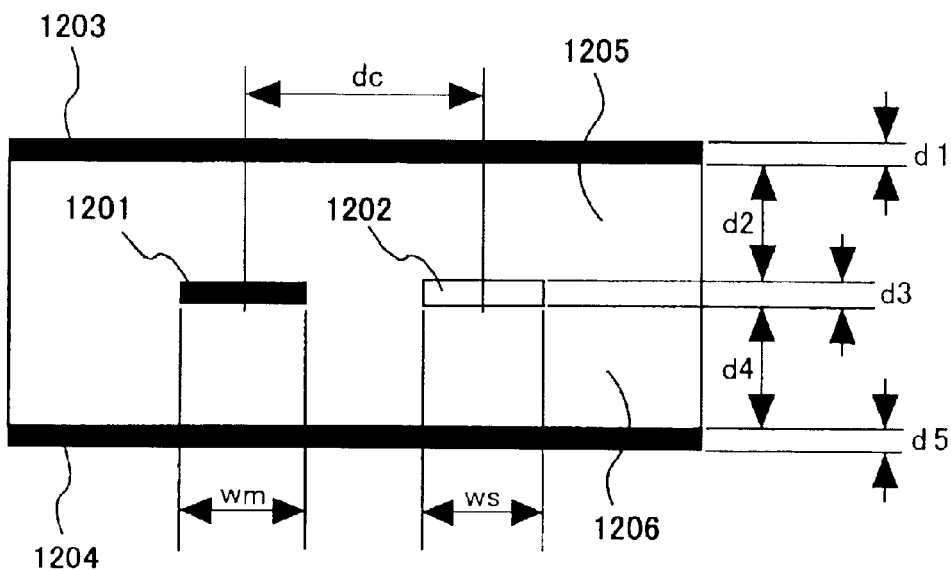
FIG. 12 is an explanatory view for explaining layer structure information as an embodiment according to the present invention.
FIG. 13 is an explanatory view showing a structure of the layer structure information as an embodiment according to the present invention.

To determine the coupler length, as shown in FIG. 12, the thicknesses d1 and d5 of power source layers 1203 and 1204, the thicknesses d2 and d4 of insulating layers 1205 and 1206, the thickness d3 of main and stub lines 1201 and 1202 are necessary in addition to the coupler interval Dc, main line width wm and stub line width ws of the coupler information 301 (FIG. 3), which are stored in the coupler/layer information storage sections 1906 and 1927. Therefore, these values are stored in the coupler/layer information storage sections 1906 and 1927 as layer structure information 1301 (FIG. 13), similarly to the coupler information 301. Also each of the layer structure information 1301 can be respectively registered in the coupler/layer information storage sections 1906 and 1927 via the circuit diagram editor 1902 or the layout diagram editor 1922 from the input apparatuses 1912 and 1932, similarly to the coupler information 301. By respectively issuing an instruction from each of the input apparatuses 1912 and 1932 to the circuit diagram editor 1902 or the layout diagram editor 1922, each of the layer structure information 1301 can be displayed by the display apparatuses 1911 and 1931, respectively.

When the coupler length is set, information relating to board material, information relating to driver specifications, and information relating to design conditions of the coupler are moreover necessary. The board material information includes dielectric constant (relative permittivity) ∈ r of an insulating material used for the printed circuit board and resistance coefficient σ, as shown in FIG. 14A. The driver information includes waveform transition times tr and tf and a signal output level VH, as shown in FIG. 14B. Moreover, the coupler design condition information includes a minimum input signal level Vsw, a maximum coupler length Lcmax and a maximum input signal width Tw, as shown in FIG. 14C. Although illustrations are not made in FIG. 19, also these values are registered in the corresponding storage section.

Figure 17:
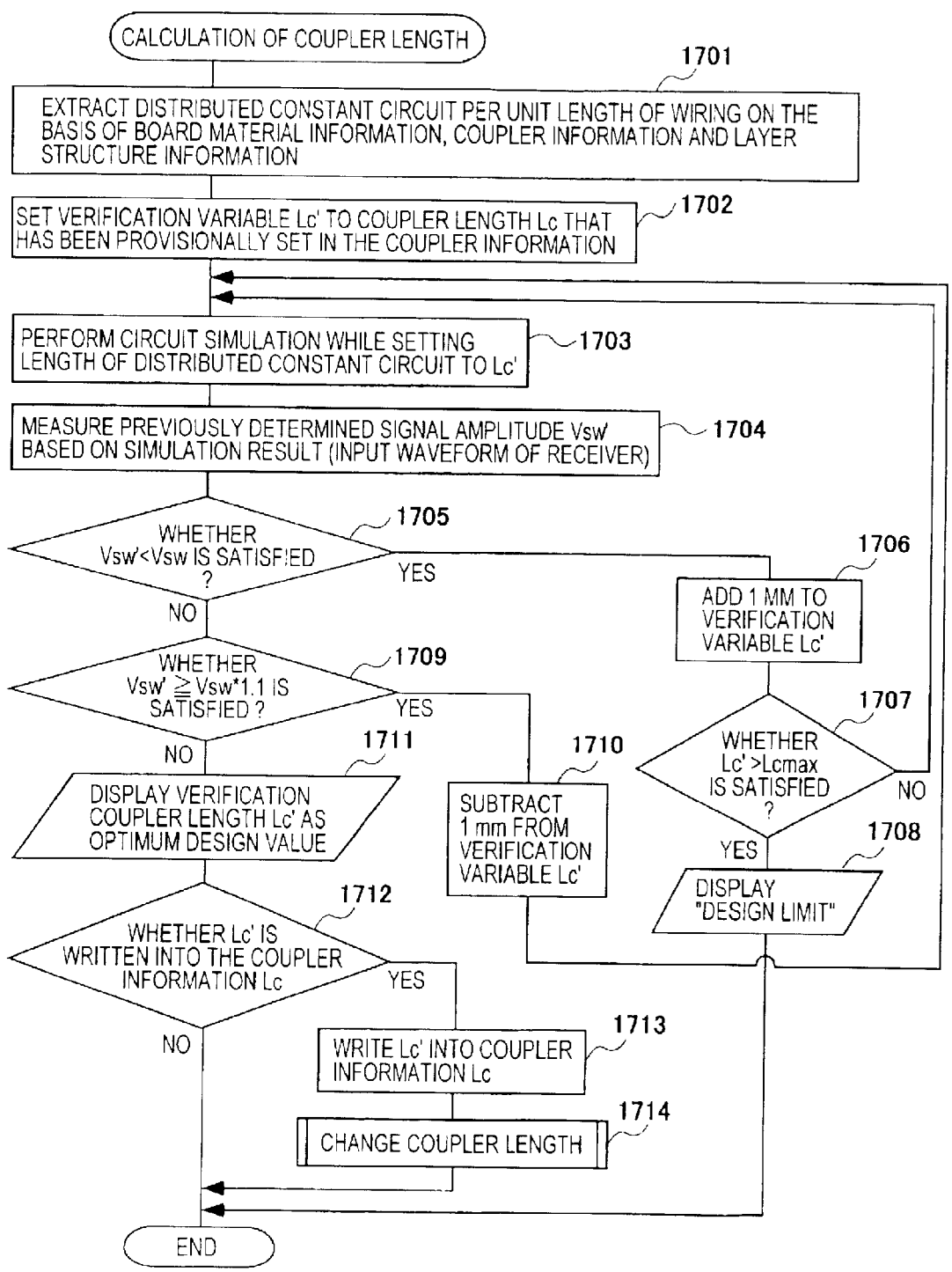
FIG. 17 is a flowchart showing processing procedures for setting the coupler length as an embodiment according to the present invention.

Next, procedures for setting the coupler length will be described in accordance with the flowchart shown in FIG. 17. Since the coupler length is necessary information in layouting the couplers, the coupler length must be at least once determined prior to the layout. Accordingly, in this embodiment, the coupler length setting section 1907 is provided in the circuit diagram design support apparatus 1900, and the coupler length setting section 1928 similar to the coupler length setting section 1907 is provided also in the layout diagram design support apparatus 1920 in consideration for the determination of the coupler length in layouting the couplers. An operation of the coupler length setting section 1907 of the circuit diagram design support apparatus 1900 will be described below.

First, the coupler length setting section 1907 obtains a distributed constant circuit per unit length of the coupler on the basis of the board material information shown in FIG. 14A, the coupler information 301 shown in FIG. 3 and the layer structure information 1301 shown in FIG. 13 (Step 1701). A simulator for obtaining the distributed constant circuit from the board cross-section shape is used. A distributed constant circuit model can be obtained by this processing.

Next, the verification variable Lc' is set to the coupler length Lc that has been provisionally set in the coupler information 301 (Step 1702). Thus, the start point for verification is defined.

Figure 15:
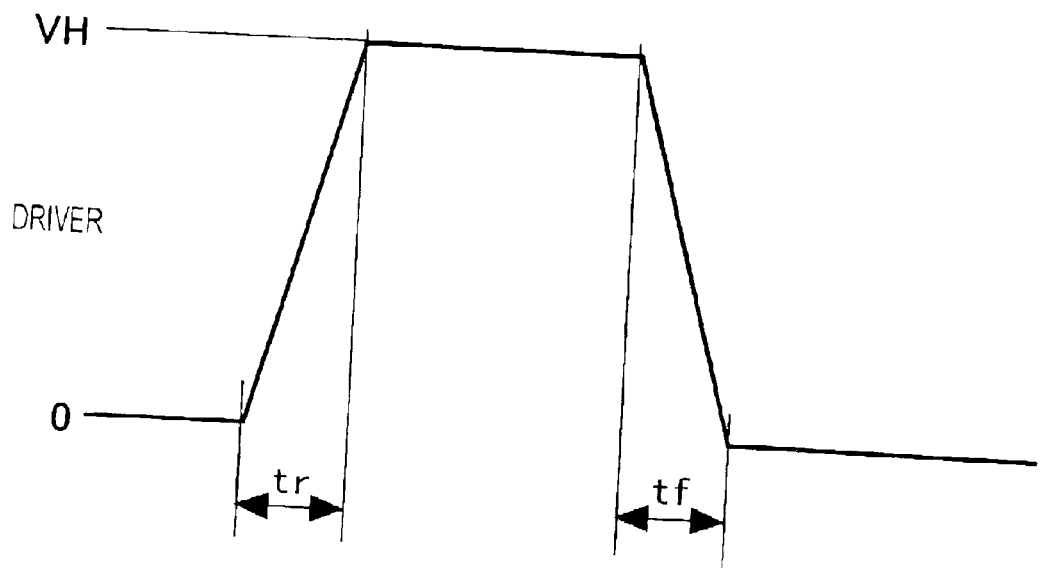
FIG. 15 is an explanatory view illustrating an output waveform of a driver output.
Figure 16:
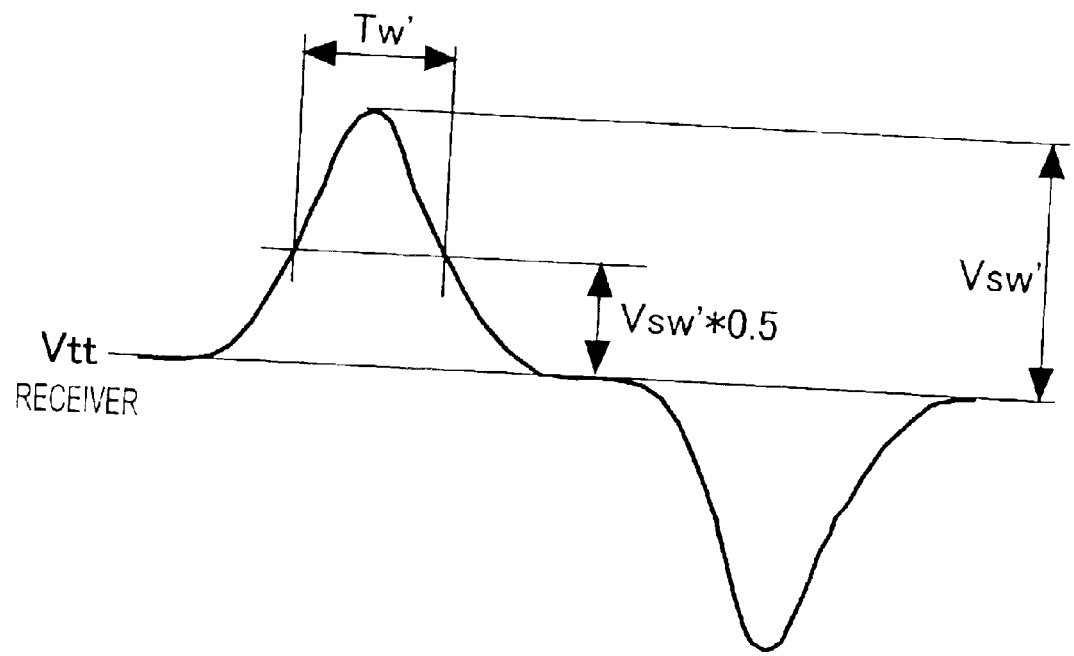
FIG. 16 is an explanatory view illustrating an input waveform of a receiver.

Next, the distributed constant circuit per the unit length obtained in Step 1701 and the length of the verification variable Lc' set in Step 1702 are given to the simple circuit simulator 1903, and a circuit model at the verification coupler length is generated. Thus, a circuit simulation is performed by this circuit model (Step 1703). Herein, as shown in FIG. 14B and FIG. 15, a waveform supplied to the receiver via the verification coupler is examined by use of the waveform having the waveform transition times tr and tf of 500 ps and the signal output level VH of 1.8 V as the output waveform of the driver. To be concrete, a signal amplitude Vsw' is measured based on the input waveform of the receiver shown in FIG. 16 (Step 1704). Subsequently, the magnitude relation between the signal amplitude Vsw' and the signal amplitude Vsw of the coupler design condition information shown in FIG. 14C is checked (Step 1705). Then, when the Vsw' is not smaller than Vsw, it is decided that the coupler length Lc is short, and 1 mm is added to the verification variable Lc' (Step 1706). The value obtained by adding 1 mm to the verification valuable Lc' is compared with the maximum coupler length Lcmax (Step 1707). When Lc' is larger than Lcmax, it is decided that a design limit is brought about, and the display apparatus 1911 displays "Design Limit" (Step 1808). Moreover, if Vsw' is equal to Lcw or less, the procedure returns to Step 1703.

In the decision in Step 1705, when it is decided that the measurement signal amplitude Vsw' is smaller than Vsw, it is decided that the signal amplitude is large contrarily if the measurement signal amplitude Vsw' has a value more than 110% of the minimum signal amplitude Vsw of the coupler design condition information (Step 1709), and 1 mm is subtracted from the verification variable Lc' (Step 1710). Thereafter, the procedure returns to Step 1703.

If the measurement signal amplitude Vsw' is equal or more than the design minimum signal amplitude Vsw or more and less than 110% of the design minimum signal amplitude Vsw, it is decided that the coupler length is a design optimum value, and the display apparatus 1911 displays that this coupler length is optimum (Step 1711). Then, the user is inquired of as to whether Lc' is written into the coupler information 301 (Step 1712). When the user wishes to write the Lc' into the coupler information 301, the value of Lc' is written to the coupler information 301 (Step 1713). Thereafter, if the preparation of the layout diagram is in progress, the foregoing processing of the coupler length change shown in FIG. 11 is performed (Step 1714).

As described above, the user gives the necessary signal amplitude Vsw for the signal receiving by the receiver, whereby the optimum coupler length Lc can be automatically calculated, and an increase in design efficiency and high performance of the bus system using crosstalk can be achieved.

Next, wiring rule information 1801 stored in the wiring rule information storage section 1925 of the layout diagram design support apparatus 1920 will be described by use of FIG. 18.

This wiring rule information 1801 is information necessary for checking once after the preparation of the circuit layout diagram whether wiring rule offence exists. In this wiring rule information 1801, the via-to-wiring minimum interval ds1, the via-to-via minimum interval ds2, the wiring-to-wiring minimum interval ds3, the coupler-to-coupler minimum interval ds4, the coupler-to-wiring minimum interval ds5 and the coupler-to-via minimum interval ds6 are decided. Herein, the coupler is not treated as mere two wirings like the prior art, and the coupler is treated as one component. Accordingly, the coupler-to-coupler minimum interval ds4, the coupler-to-wiring minimum interval ds5 and coupler-to-via minimum interval ds6 are additionally decided, which have not been contained in the conventional wiring rule information.

As described above, in this embodiment, since the coupler is treated as the one component, the interval between the two wirings constituting the coupler needs not to be checked and moreover the check of the interval between each of the two wirings constituting the coupler and each of other wirings needs not to be performed. Accordingly, operation efficiency can be enhanced. Furthermore, though the coupler is constituted by the two wirings, one function is originally realized by the two wirings, and the signal amplitude treated by the two wirings as the coupler is slight. Accordingly, the coupler is treated as one component, and the interval between this coupler and other wirings is defined. Thus, the coupler function can be secured more surely.

Note that in the foregoing descriptions, the via means an inter-layer wiring and the wiring means the one formed in one layer.

Figure 21:
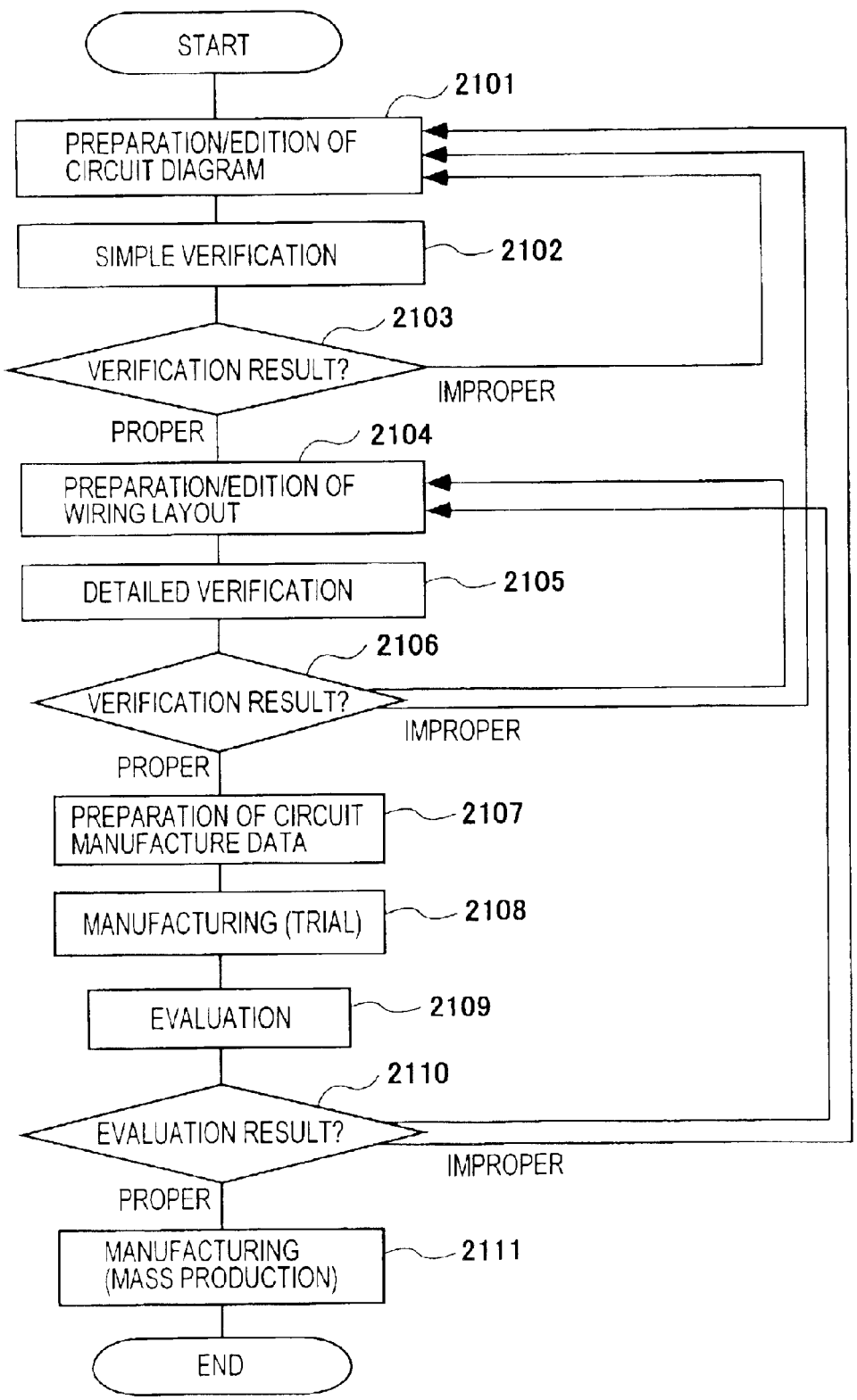
FIG. 21 is a flowchart showing procedures from a design of a printed circuit board to a manufacture of the same as an embodiment according to the present invention.

Next, an operation of the design support system of this embodiment will be described in accordance with the flowchart shown in FIG. 21.

First, the circuit diagram editor 1902 of the circuit diagram design support apparatus 1900 accepts an instruction from the user, and executes a preparation/edition of the circuit diagram (Step 2101). In Step 2101, various symbols stored in the component symbol storage section 1904 are arranged, and the symbols thus arranged are coupled to each other. The prepared circuit diagram is stored in the circuit diagram information storage section 1905 as circuit diagram information. Note that Step 2101 will be described later in detail by use of FIG. 22.

Next, the simple simulator 1903 of the circuit diagram design support apparatus 1900 accepts the instruction from the user, and simulates the operation of the circuit illustrated in the circuit diagram prepared in Step 2101 (Step 2102). The simple simulator 1903 confirms the circuit operation (Step 2103). In this simulation, a rough estimate of materials used in the manufacture and the wiring length after the wiring layout are performed in addition to a rough circuit operation simulation. Moreover, a simulation of the foregoing setting of the coupler length by use of FIG. 17 is performed.

As a result of the foregoing simulation (Step 2103), if the circuit diagram is improper, the simple simulator 1903 allows the display apparatus 1911 to display the contents of the improper portion, and urges the layout diagram editor 1902 to prepare and edit the circuit diagram (Step 2101). Moreover, if the circuit diagram is proper, the layout diagram editor 1922 of the layout diagram design support apparatus 1920 accepts the instruction from the user, and prepares and edits the wiring layout (Step 2104). In the stage when the procedure transits to the preparation of the layout diagram, the circuit diagram information stored in the circuit diagram information storage section 1905 of the circuit diagram design support apparatus 1900 and the coupler information and the layer structure information stored in the coupler/layer information storage section 1906 thereof are sent to the layout diagram design support apparatus 1920 by the communication section 1908. The information from the circuit diagram design support apparatus 1900 is received by the communication section 1908 of the layout diagram design support apparatus 1920, and stored in the circuit diagram information storage section 1925 and the coupler/layer information storage section 1906.

In Step 2104, the layout section (component arrangement means) 1935 of the layout diagram editor 1922 arranges the components, wirings and the like, which are shown by the circuit diagram information, in accordance with the instruction from the user. The information relating to the components and the wirings, which are to be arranged here, has one-to-one correspondence with the information of the circuit diagram prepared in Step 2101. When the layout diagram is prepared in the layout section 1935, the information in the layout diagram is stored in the layout diagram information storage section 1925 as the layout diagram information. Thereafter, the wiring check section 1936 checks the wirings of the layout diagram, and if erroneous points exist, the contents of the erroneous points are displayed, and re-edition of the layout diagram by the layout section 1935 is urged. Note that the detailed operation of the layout section 1935 and the detailed operation of the wiring check section 1936 in the foregoing Step 2104 will be later described by use of FIGS. 23, 24 and 25.

Next, the detailed simulator 1923 of the layout diagram design support apparatus 1920 accepts an instruction from the user, and simulates the operation of a circuit illustrated in the layout diagram prepared in Step 2104 (Step 2105), and confirms the circuit operation (Step 2106). In this simulation (Step 2105), a more detailed simulation than the simple simulation in Step 2102 is performed. To be concrete, a delay time of the wiring and crosstalk noises between the adjacent wirings and the like are verified by the circuit simulation.

As a result of the foregoing detailed simulation (Step 2105), if the layout diagram is not improper, the detailed simulator 1923 allows the display apparatus 1931 to display the contents of the improper portions, and urges the layout diagram editor 1922 to prepare and edit the layout diagram (Step 2104). For example, as a result of the detailed simulation, when it is proved that a proper operation is not performed owing to the coupler length, the procedure returns to Step 2104, and the changing processing of the coupler length shown in FIG. 11 is performed. Moreover, if the layout diagram is proper, the manufacture data editor 1942 of the circuit manufacture data preparation apparatus 1940 converts the layout diagram information from the layout diagram design support apparatus 1920 to circuit manufacture data, and registers the circuit manufacture data in the circuit manufacture data storage section 1943 (Step 2107). Note that the circuit manufacture data is sometimes called cover data.

After going through the foregoing steps, the processing by the design support system of this embodiment is completed.

Thereafter, a trial manufacture of the printed circuit board is performed based on the circuit manufacture data stored in the circuit manufacture data storage section 1943 of the circuit manufacture data preparation apparatus 1940 (Step 2108). The operation in Step 2108 may include an operation to load functional components on the printed circuit board.

After the manufacture of the prototype circuit board (Step 2108), the prototype circuit board is actually operated, and the operation state is verified and evaluated (Step 2109). If the results of the verification and evaluation are failing, the procedure returns either to the wiring layout preparation processing of Step 2104 or to the circuit diagram preparation processing of Step 2101. If the results thereof are successful, the mass production of the printed circuit board is actually carried out (Step 2111).

Figure 22:
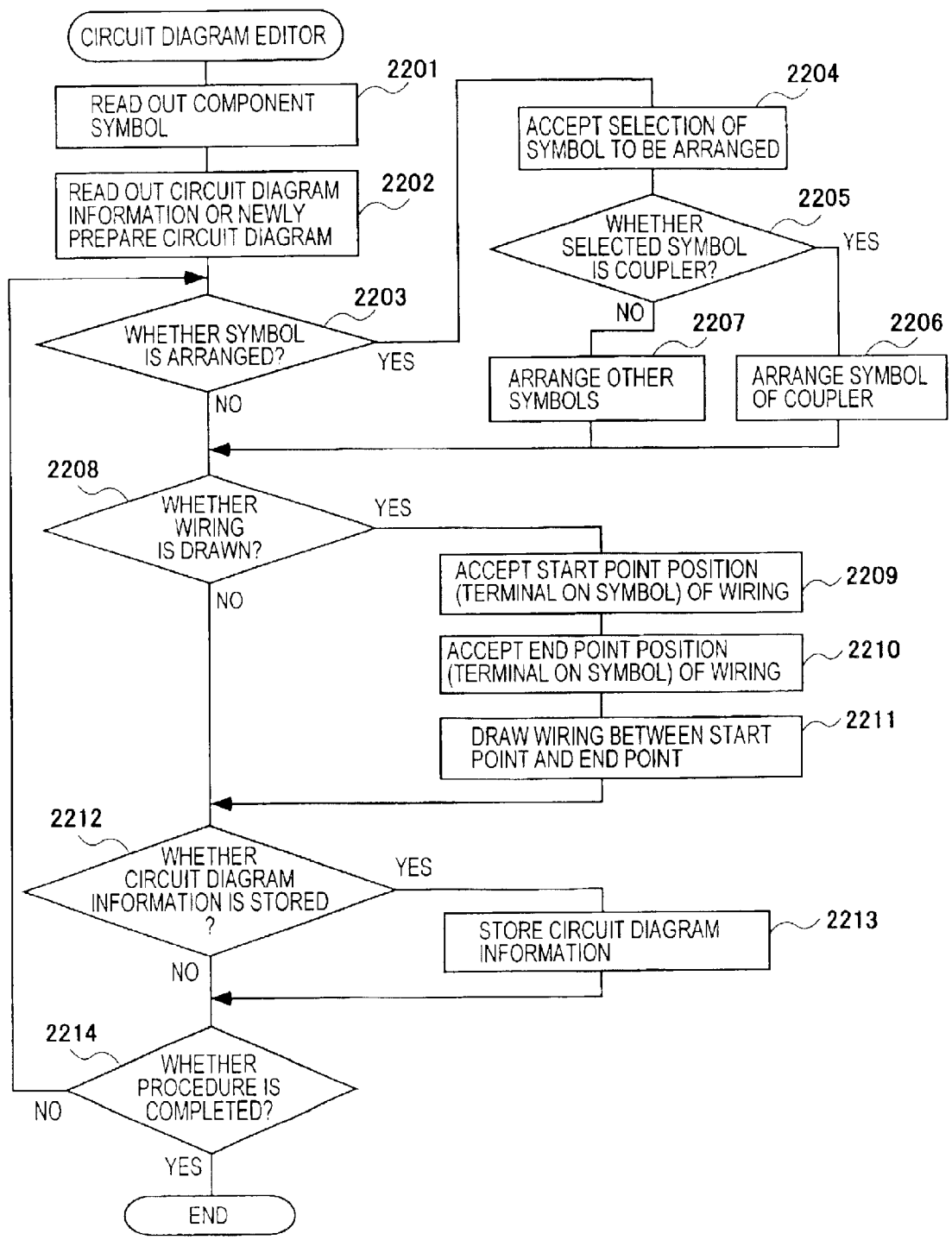
FIG. 22 is a flowchart showing an operation of a circuit diagram editor as an embodiment according to the present invention.

Next, in accordance with the flowchart shown in FIG. 22, the detail of the above described circuit diagram preparation/edition processing (Step 2101) will be described.

When the circuit diagram editor 1902 of the circuit diagram design support apparatus 1900 starts up, the circuit diagram editor 1902 first reads out the component symbol from the component symbol storage section 1904 (Step 2201). Subsequently, if the instruction from the user indicates the change of the circuit diagram information, the circuit diagram editor 1902 reads out the circuit diagram information stored in the circuit diagram information storage section 1905, and allows the display apparatus 1911 to display the screen of the circuit diagram. When the instruction from the user indicates the new preparation of the circuit diagram, the circuit diagram editor 1902 allows the display apparatus 1911 to display the screen for preparing a new circuit diagram (Step 2202).

Next, the input apparatus 1912 accepts the symbol arrangement instruction or the wiring arrangement instruction (Step 2203 or Step 2208). When the symbol arrangement instruction is accepted in Step 2203, the circuit diagram editor 1902 allows the display apparatus 1911 to display various component symbols and accepts the selection of the symbol to be arranged (Step 2204). The circuit diagram editor 1902 decides whether the symbol selected by the user is the coupler or not (Step 2205), and if the symbol is the coupler, the circuit diagram editor 1902 arranges the symbol of the coupler at a desired position in accordance with the instruction from the user (Step 2206). It is preferable that the user registers the coupler information and the layer structure information in the coupler/layer information storage section 1906 at this stage. At this time, with regard to the coupler length Lc that is one of the coupler information, herein the circuit diagram editor 1902 may allow the coupler length setting section 1907 to operate to set the coupler length as described above by use of FIG. 17. The coupler length setting section 1907 may also set the coupler length immediately before the wiring constituting the coupler is actually arranged. Moreover, if the symbol selected by the user is not the coupler, the circuit diagram editor 1902 arranges this symbol at a desired position in accordance with the instruction from the user (Step 2206).

Figure 26:
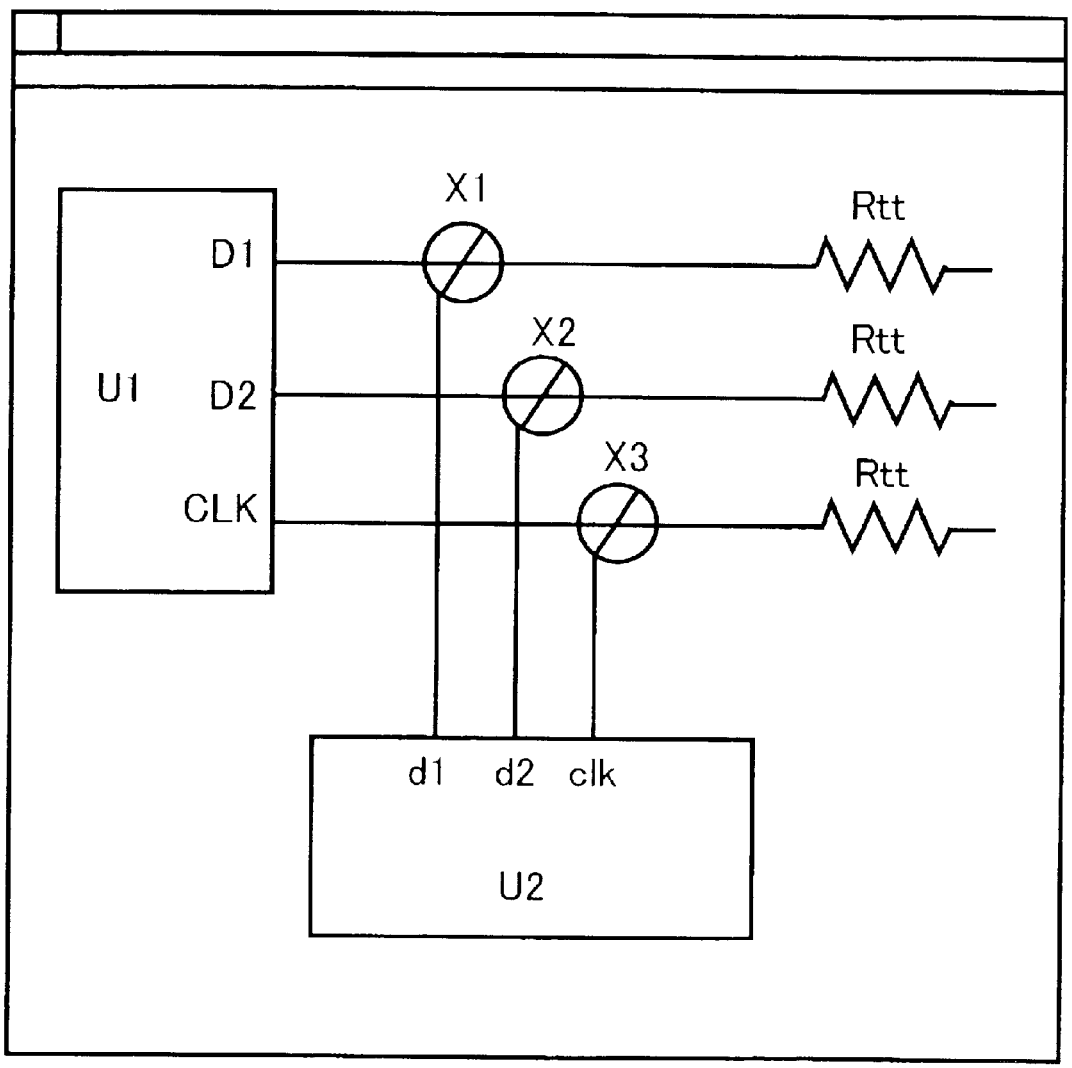
FIG. 26 is an explanatory view illustrating a display screen of a circuit diagram as an embodiment according to the present invention.

Furthermore, when the input apparatus 1912 accepts the wiring arrangement instruction in Step 2208, a start point position of the wiring is accepted (Step 2209). In this case, the user may designate the terminal in the component symbol on the display screen, or input the coordinates of the wiring start point position. Subsequently, similarly to the acceptance of the start point position, the end point position of the wiring is accepted (Step 2210). Upon receipt of the start point position and the end point position, the wiring is drawn between the start point and the end point (Step 2211). If the circuit diagram around the coupler is provisionally prepared in the above described manner, the screen as shown in FIG. 26 is displayed on the display apparatus 1911 at this stage. Note that the circuit diagram displayed on this screen is identical to that shown in FIG. 6.

After Step 2208 or Step 2211, the storing instruction of the circuit diagram and the completion instruction of the circuit diagram preparation/edition are not accepted (Step 2212, S2214), the procedure returns to Step 2203. Furthermore, when the storing instruction of the circuit diagram is accepted in Step 2212, the information of the circuit diagram is stored in the circuit diagram information storage section 1905 (Step 2213). When the completion instruction of the circuit diagram preparation/edition is accepted in Step 2214, the procedure is completed.

As described above, in this embodiment, since, in the circuit diagram, the coupler is illustrated by the symbol as one component, it is possible to discriminate which portion in the circuit diagram constitutes the coupler. Accordingly, the user can easily recognize the correlation with the layout diagram. It is possible for the layout diagram design support apparatus 1920 for preparing the layout diagram to recognize which portion should be arranged as the coupler.

Figure 23:
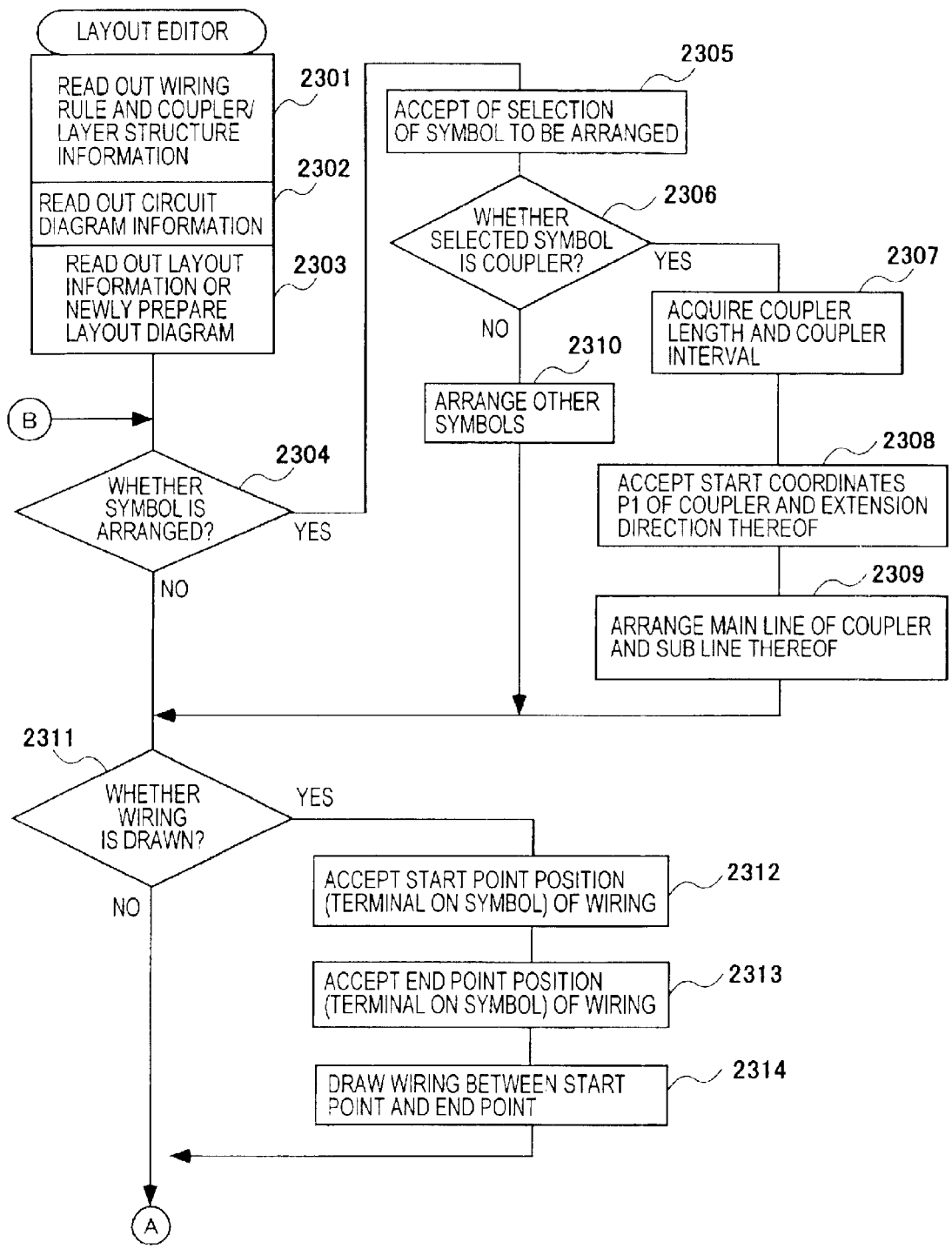
FIG. 23 is a flowchart (1) showing an operation of a layout diagram editor as an embodiment according to the present invention.

Next, in accordance with the flowchart illustrated in FIGS. 23 and 24, the detail of the above described wiring layout preparation/edition processing (Step 2104) will be described.

When the layout diagram editor 1922 of the layout diagram design support apparatus 1920 starts up, the layout section 1935 of the editor 1922 reads out wiring rule information from the wiring rule information storage section 1926, and reads out coupler information and layer structure information from the coupler/layer information storage section 1927 (Step 2301). Furthermore, the layout section 1935 reads out circuit diagram information stored in the circuit diagram information storage section 1924 (Step 2302). Note that the wiring rule information may be read out when wiring rule check to be described later is executed. Subsequently, when the instruction from the user is the change of layout diagram information, the layout diagram information stored in the layout diagram information storage section 1925 is read out, and the screen of the layout diagram is displayed on the display apparatus 1931. When the instruction from the user is the new preparation of the layout diagram, the screen for preparing a new layout diagram is displayed on the display apparatus 1931 (Step 2303).

Next, the input apparatus 1932 accepts the symbol arrangement instruction or the wiring arrangement instruction (Step 2304 or Step 2311). When the symbol arrangement instruction is accepted in Step 2304, the instruction indicating which symbol in the circuit diagram is arranged in the layout diagram (Step 2305). The layout section 1935 decides whether the symbol selected by the user is the coupler or not (Step 2306). If the symbol is the coupler, the layout section 1935 refers to the component number of the coupler symbol and reads out the corresponding coupler information 301 from the coupler/layer information storage section 1927 to acquire the coupler length Lc and the coupler interval Dc (Step 2307). Subsequently, when the layout section 1935 accepts the start coordinates P1 of the coupler and the extension direction of the coupler (Step 2308), the layout section 1935 arranges the main line and the sub line as described above by use of FIG. 8 and the like (Step 2309). Note that if the main line and the sub line overlap the other wirings and other functional components when wiring the main line and the sub line, the main line and the sub line are basically arranged so as to detour other wirings and other functional components. However, when "Deformation Allowed/Not Allowed" represents "Not Allowed" in the circuit information 301 shown in FIG. 3, it is displayed whether other wirings and other functional components may be moved. If a movement permission is accepted, other wirings and other functional components are moved, and the linearity of the main line and the sub line is secured.

In Step 2306, if the symbol selected by the user is not coupler, information relating to coordinates and the like necessary for the arrangement of the symbol is accepted, and the symbol is arranged in accordance with this information (Step 2310). Although the component symbol arranged in this stage may be identical to the component symbol arranged in the circuit diagram, the component symbol arranged in this stage preferably corresponds to the actual dimension of the component For example, in a case of a resistor, the component symbol preferably corresponds to the actual length of the resistor. In this case, as a matter of course, the layout diagram design support apparatus 1920 also must have a component symbol storage section in which such symbol is stored.

Figure 27:
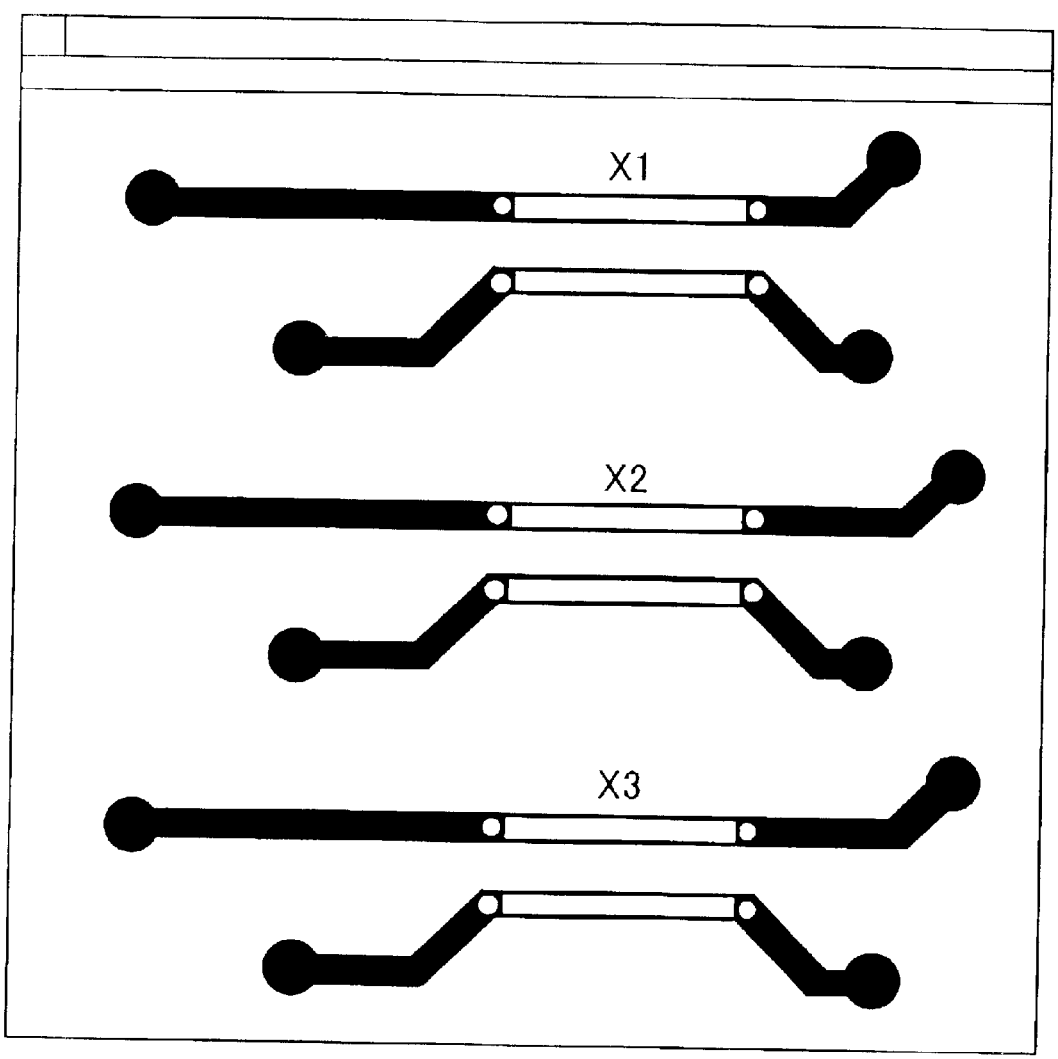
FIG. 27 is an explanatory view illustrating a display screen of a layout diagram as an embodiment according to the present invention.

Furthermore, when the wiring arrangement instruction is accepted in Step 2311, the start point position of the wiring is accepted (Step 2312). In this case, the user may designate the terminal in the component symbol on the display screen, or alternatively the user may enter the coordinates of the wiring start point position. Subsequently, similarly to the acceptance of the start point position, the end point position of the wiring is accepted (Step 2313). When the start point position and the end point position are accepted, the wiring is drawn from the start point to the end point (Step 2314). In the above described manner, if the layout diagram around the coupler is provisionally prepared, the screen as shown in FIG. 27 is displayed on the display apparatus 1931 at this stage. Note that the layout diagram illustrated on this screen is identical to that illustrated in FIG. 8.

Figure 24:
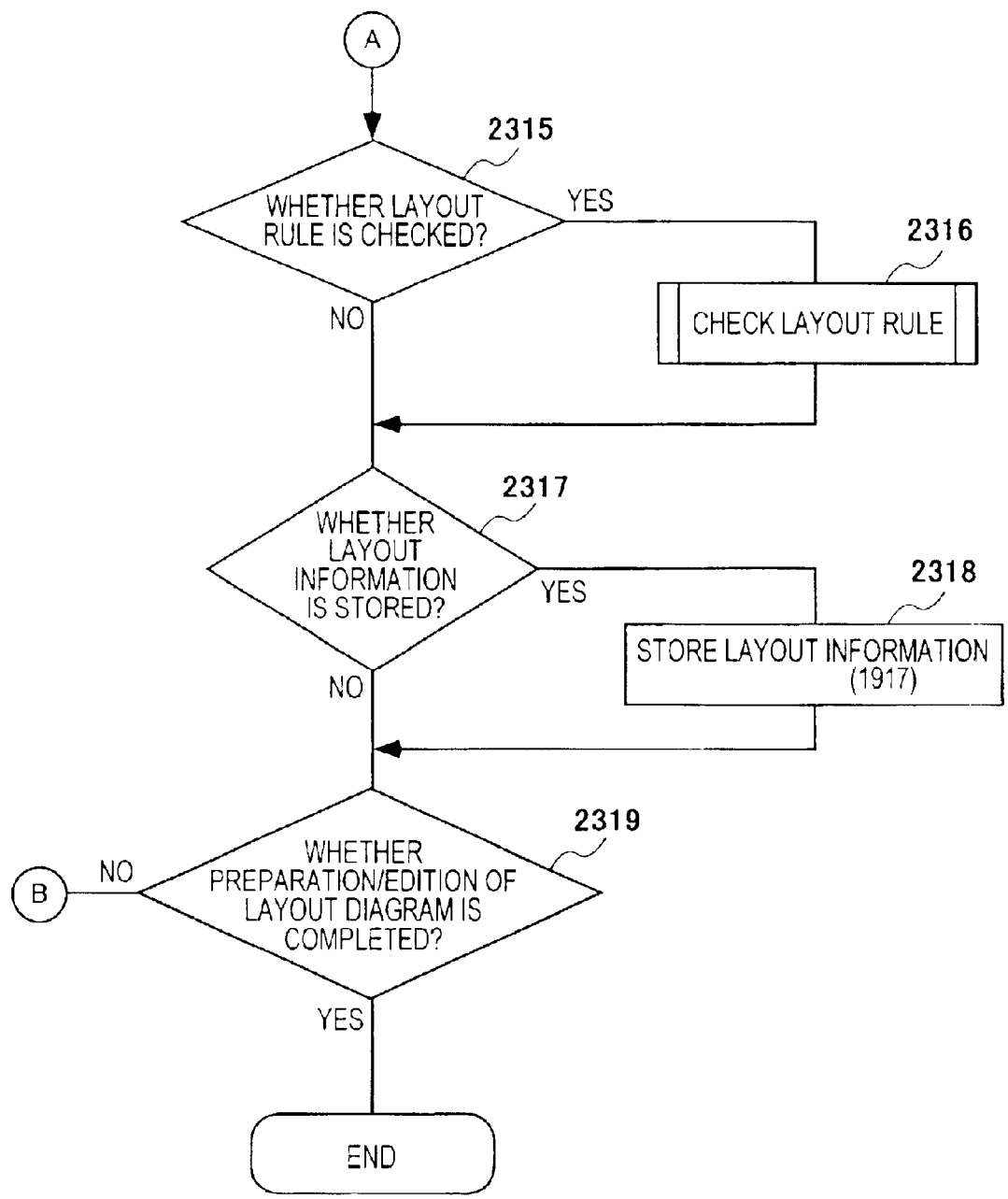
FIG. 24 is a flowchart (2) showing an operation of a layout diagram editor as an embodiment according to the present invention.

When the wiring rule check execution is accepted after drawing the wiring (Step 2315) (hereinafter, the procedures until Step 2321 are illustrated in FIG. 24), the wiring check section 1936 of the layout diagram editor 1922 starts up, and checks the wiring interval by use of the wiring rule information read out in Step 2301 (Step 2316).

After Step 2315 or Step 2316, if the storing instruction of the layout diagram and the completion instruction of the layout diagram preparation/edition are not accepted (Step 2317, Step 2319), the procedure returns to Step 2304 of FIG.

23. Furthermore, when the storing instruction of the layout diagram is accepted in Step 2317, the information of this layout diagram is stored in the layout diagram information storage section 1925 (Step 2318). When the completion instruction of the layout diagram preparation/edition is accepted in Step 2319, the foregoing procedures are completed.

Figure 25:
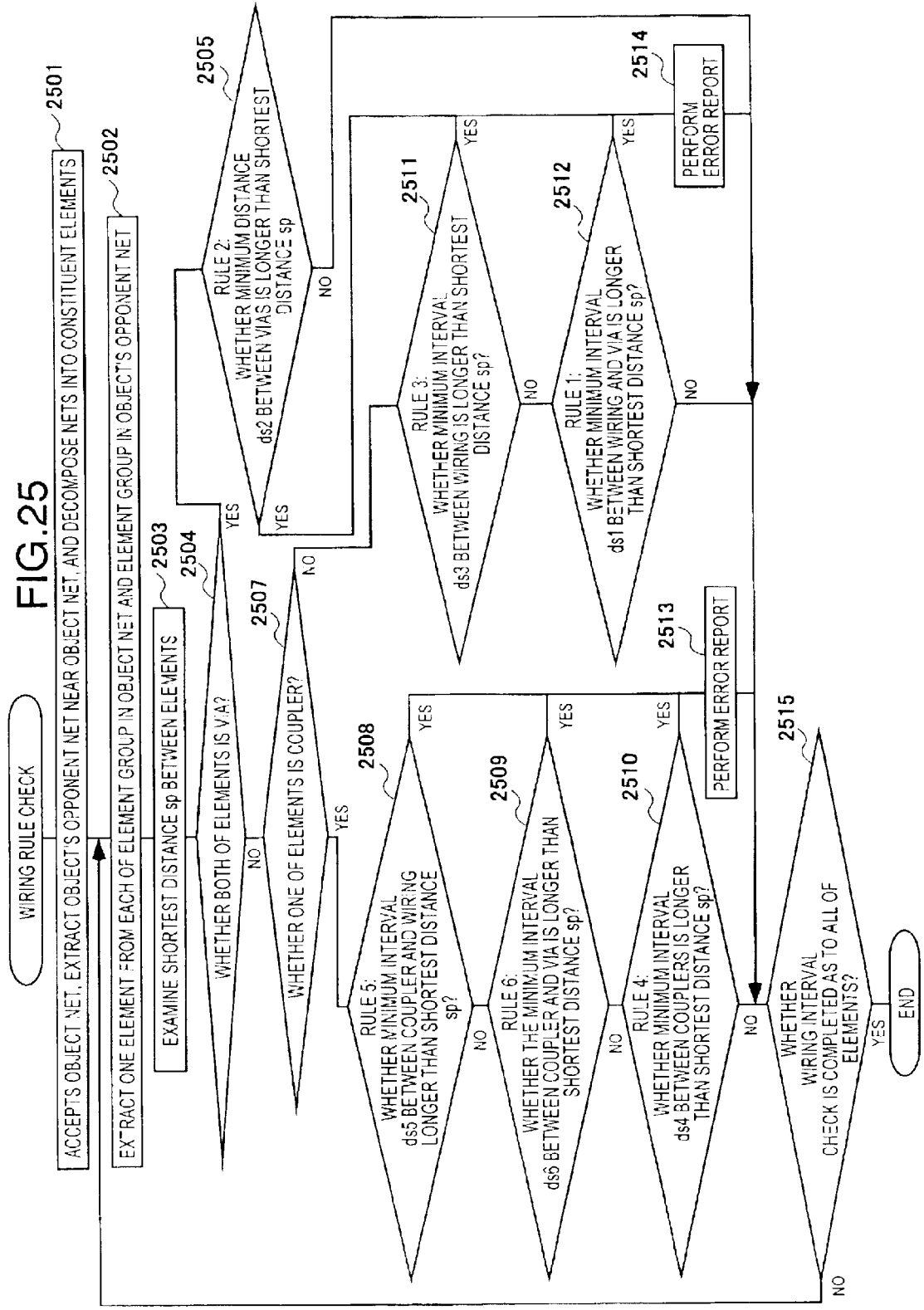
FIG. 25 is a flowchart showing an operation of a wiring check section as an embodiment according to the present invention.

Next, the detail of the wiring rule check in Step 2316 of FIG. 24 will be described in accordance with the flowchart illustrated in FIG. 25.

In this wiring rule check, the object extraction sub-section 1937 of the wiring check section 1936 first starts up, and accepts the object net. The object extraction sub-section 1937 extracts the object's opponent net near the object net, and decomposes these nets into constituent elements (Step 2501). When the object's opponent net near the object net is extracted, all nets within a range previously determined for the object net are extracted. Herein, the net includes a chain of wirings extending from a terminal of a certain component to terminals of other components, or a chain of wirings and functional components connected to the chain of wirings. The "decomposition of the net into the constituent elements" means to decompose the net into the wiring and the functional component, and to decompose the chain of wirings at its bent points, its branch points and the like and to separate the wiring into straight line components alone or into curved line components alone with certain curvatures.

By the way, the coupler is not treated as two wirings but as one component in this embodiment. Accordingly, even if the coupler exists in the object net or in the object's opponent net, the coupler is not decomposed into two wirings, and the wiring rule check is carried out for one coupler. Therefore, the mutual interval between the two wirings constituting the coupler is not subjected to the wiring rule check. Whether the coupler exists in the object net or the object's opponent net is decided depending on whether an item indicating a component number attached to the coupler exists in these nets.

The object extraction sub-section 1937 extracts an element from each of an element group constituting the object net and an element group constituting the object's opponent net, and passes these elements to the wiring checker 1938 of the wiring check section 1936 (Step 2502).

The wiring checker 1938 first examines the shortest distance sp between the two elements (Step 2503). Subsequently, the wiring checker 1938 decides whether both of the two elements is a VIA (Step 2504). If the both of the two elements is the VIA, the wiring checker 1938 compares the minimum distance ds2 between the VIAs defined by the wiring rule information illustrated in FIG. 18 with the shortest distance sp examined in Step 2503 as to their magnitudes (Step 2505). As a result of this comparison, if sp<sp2 is satisfied, the wiring checker 1938 allows the display apparatus 1931 to display the expression to the effect that the two elements contravene the wiring rule (Step 2514).

Then, if the one of the two elements is the coupler and the other is the wiring, the wiring checker 1938 performs the wiring interval check by use of the minimum interval ds5 between the coupler and the wiring, which is defined by the wiring rule information 1801 (Steps 2507, 2508 and 2513). If one of the two elements is the coupler and the other is the VIA, the wiring checker 1938 performs the wiring interval check by use of the minimum interval ds6 between the coupler and the VIA, which is defined by the wiring rule information 1801 (Steps 2509 and 2513). If both of the two elements are the coupler, the wiring checker 1938 performs the wiring interval check by use of the minimum interval ds4 between the couplers, which is defined by the wiring rule information (Steps 2510 and 2513). If both of the two elements are the wiring, the wiring checker 1938 performs the wiring interval check by use of the minimum interval ds3 between the wirings, which is defined by the wiring rule information 1801 (Steps 2511 and 2514). If one of the two elements is the wiring and the other is the VIA, the wiring checker 1938 performs the wiring interval check by use of the minimum interval ds1 between the wiring and the VIA, which is defined by the wiring rule information 1801 (Steps 2512 and 2514).

When the wiring interval check is completed as to the two elements, the wiring checker 1938 decides whether the wiring interval check is completed as to all of the elements (Step 2515). If the wiring interval check is not completed as to all of the elements, the procedure returns to Step 2502. If the wiring interval check is completed as to all of the elements, the wiring rule check as to the object net and the object's opponent net is completed. Note that if there is no wiring rule violation at the completion stage of the wiring rule check, the wiring checker 1938 allows the display apparatus 1931 to display the expression to the effect that there is no wiring rule violence in the object net and the object's opponent net.

Next, a printed circuit board which is designed by the design support system described above and manufactured based on the design by the design support system will be described below.

Figure 28:
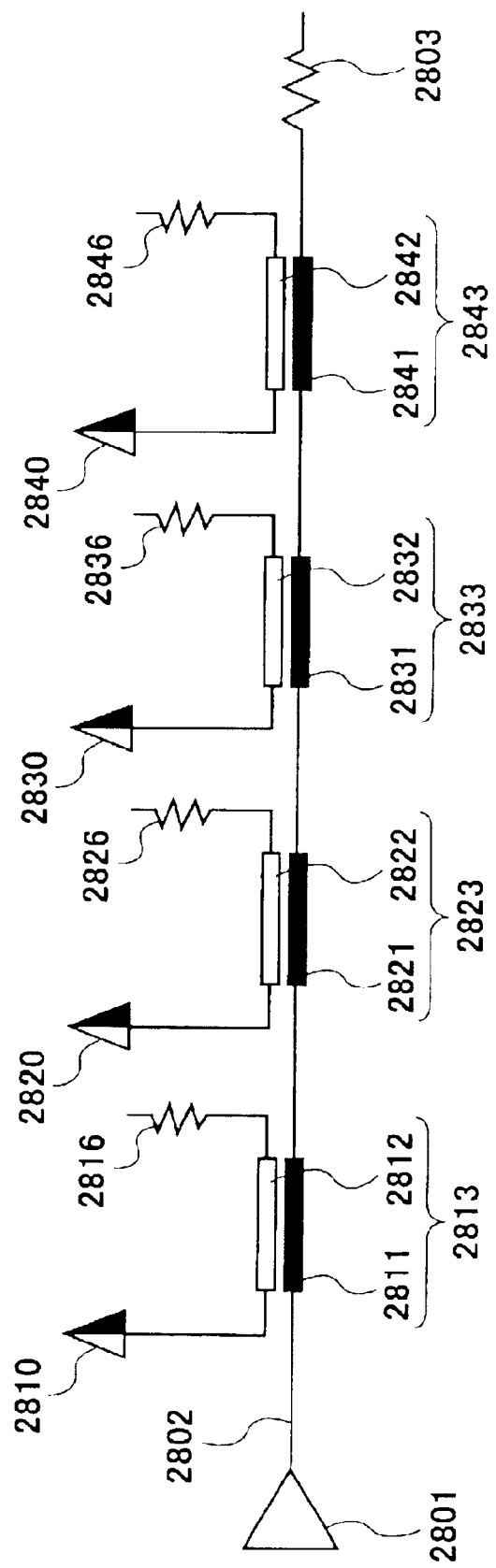
FIG. 28 is a circuit diagram of a circuit including a plurality of couplers.

First, a circuit of the printed circuit board to be manufactured will be described by use of FIG. 28.

This circuit has a driver 2801; a driver signal line 2802 extending from the driver 2801; a driver termination resistor 2803 coupled to the terminal of the driver signal line 2802; four receivers 2810, 2820, 2830 and 2840; receiver signal lines extending from the respective receivers; and receiver termination resistors 2816, 2826, 2836 and 2846 coupled to the receiver signal lines. Parts of the four receiver signal lines are arranged in parallel with the driver signal line 2802 with a constant interval therebetween. The parts of the four receiver signal lines and parts of the driver signal line 2802 in parallel with the parts of the four receiver signal lines constitute couplers 2813, 2823, 2833 and 2843. Specifically, the respective parts of the receiver signal lines form stub lines 2812, 2822, 2832 and 2842, and the plurality of the parts of the driver signal line 2802 form main lines 2811, 2821, 2831 and 2841 of the couplers, respectively.

Figure 29:
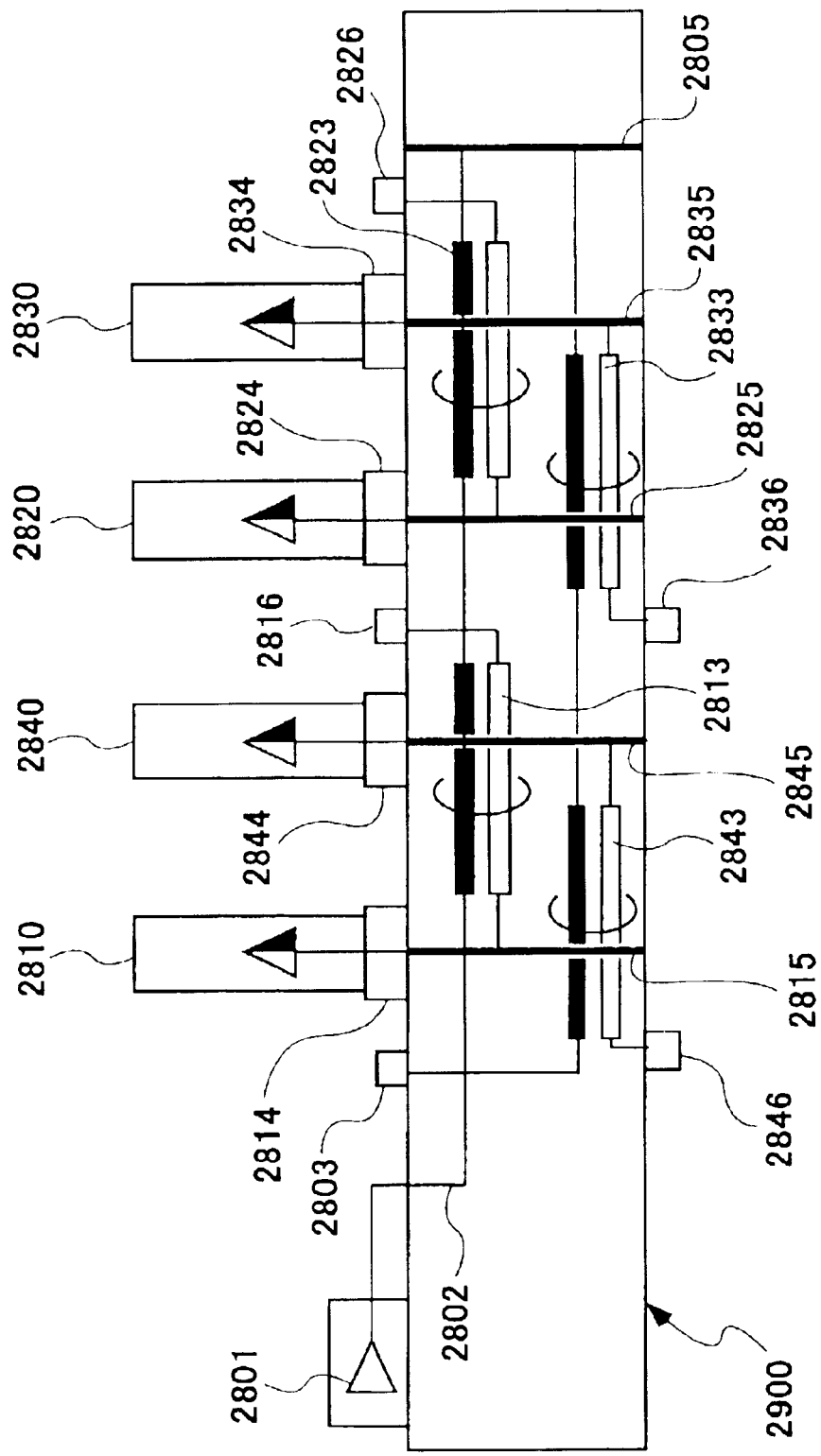
FIG. 29 is an explanatory view illustrating a structure of a conventional printed circuit board.

When the circuit described above is designed by use of the prior art, and when the printed circuit board is manufactured based on this design, the printed circuit board as shown in FIG. 29 is manufactured.

In this printed circuit board 2900, on the upper plane of the circuit board body, the driver 2801 is provided, and the first receiver 2810, the fourth receiver 2840, the second receiver 2820 and the third receiver 2830 are provided thereon at equal intervals through connectors 2814, 2844, 2824 and 2834. Moreover, the driver termination resistor 2803, the first receiver termination resistor 2816 and the second receiver termination resistor 2826 are provided on the upper plane of the circuit board body at equal intervals. On the rear plane of the circuit board body, the third receiver termination resistor 2836 and the fourth receiver termination resistor 2846 are provided. The interval between the third receiver termination resistor 2836 and the fourth receiver termination resistor 2846 is equal to that between the first receiver termination resistor 2816 and the second receiver termination resistor 2826.

From the four receiver connectors 2814, 2844, 2824 and 2834, which are provided on the upper plane of the circuit board body, provided are through holes 2815, 2845, 2825 and 2835 extending to the rear plane of the circuit board body. Each of the receiver signal lines is constituted by a first portion, which is a part of the through hole, a second portion extending from the middle of the through hole on a plane in parallel with the upper plane of the circuit board body, and a third portion extending from the end of the second portion to the termination resistor provided either on the upper plane of the circuit board body or on the rear plane thereof.

The driver signal line 2802 has a structure that the through hole 2805, which is provided at a position far from the third receiver 2830 provided at a position farthest from the driver 2801, forms its folded portion, and the line 2802 extends from the through hole 2805 to the driver termination resistor 2803 provided between the driver 2801 and the first receiver 2810.

Figure 30:
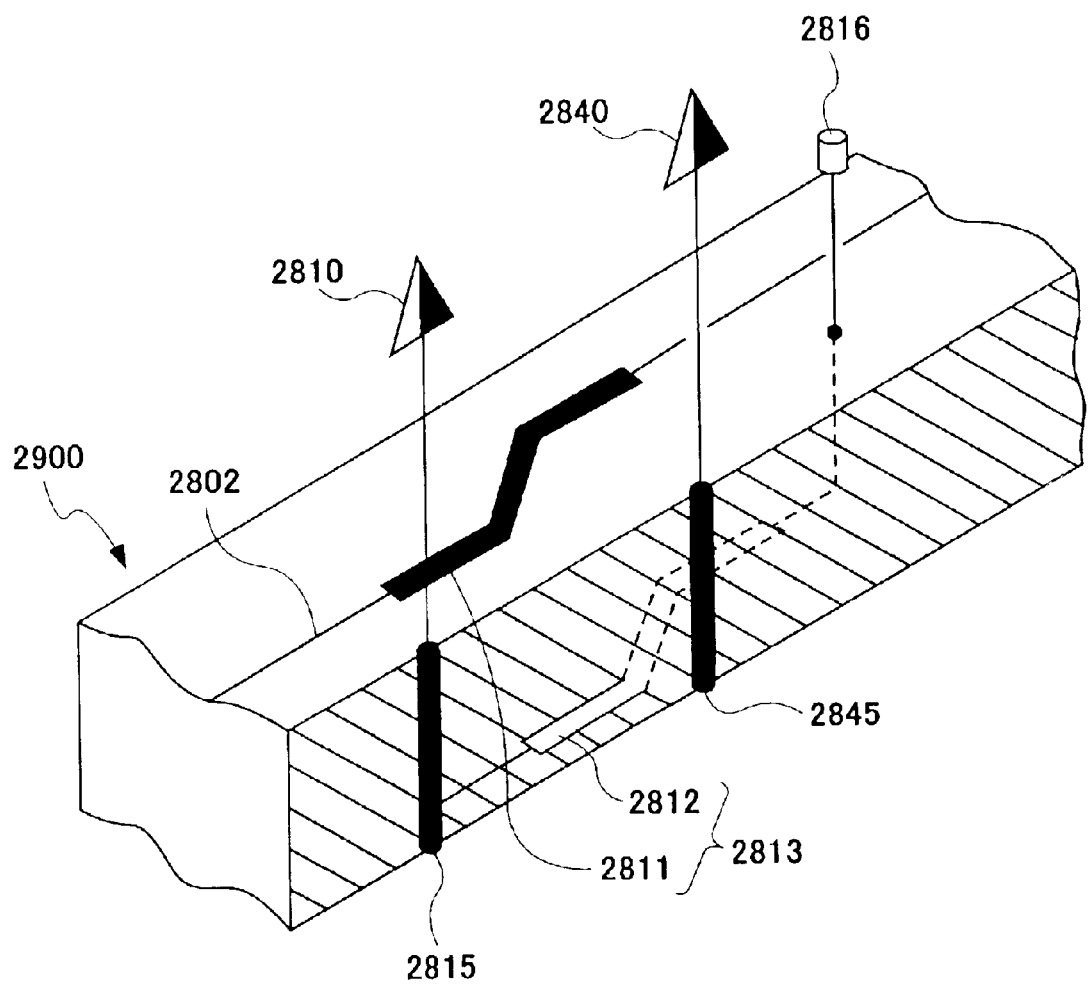
FIG. 30 is a principal part exploded perspective view of the printed circuit board illustrated in FIG. 29.

The couplers 2813, 2823, 2833 and 2843 respectively detour the through holes 2845, 2835, 2825 and 2815 to evade them. To be concrete, as shown in FIG. 30, to evade the first through hole 2815, the main line 2811 of the first coupler 2813 is apart from the first through hole 2815 with a certain distance in a horizontal direction. The stub line 2812 of the first coupler 2813 extending from the first through hole 2815 detours in a horizontal direction to evade the fourth through hole 2845. Therefore, the main line 2811 also detours similarly to the stub line 2812 to keep a situation where the main line 2811 is in parallel with the stub line 2812.

As described above, if the coupler is made to detour, reflection phenomenon of a signal occurs at the coupler and the bent portion. Therefore, a crosstalk signal skews, and it is very difficult to obtain a desired crosstalk signal. Thus, a data transfer speed cannot be increased. If it is intended to obtain the desired crosstalk signal, this coupler is split for each bent point, and a simulation must be performed for each split portion. Therefore, a large number of steps are taken for the design of the coupler.

Figure 31:
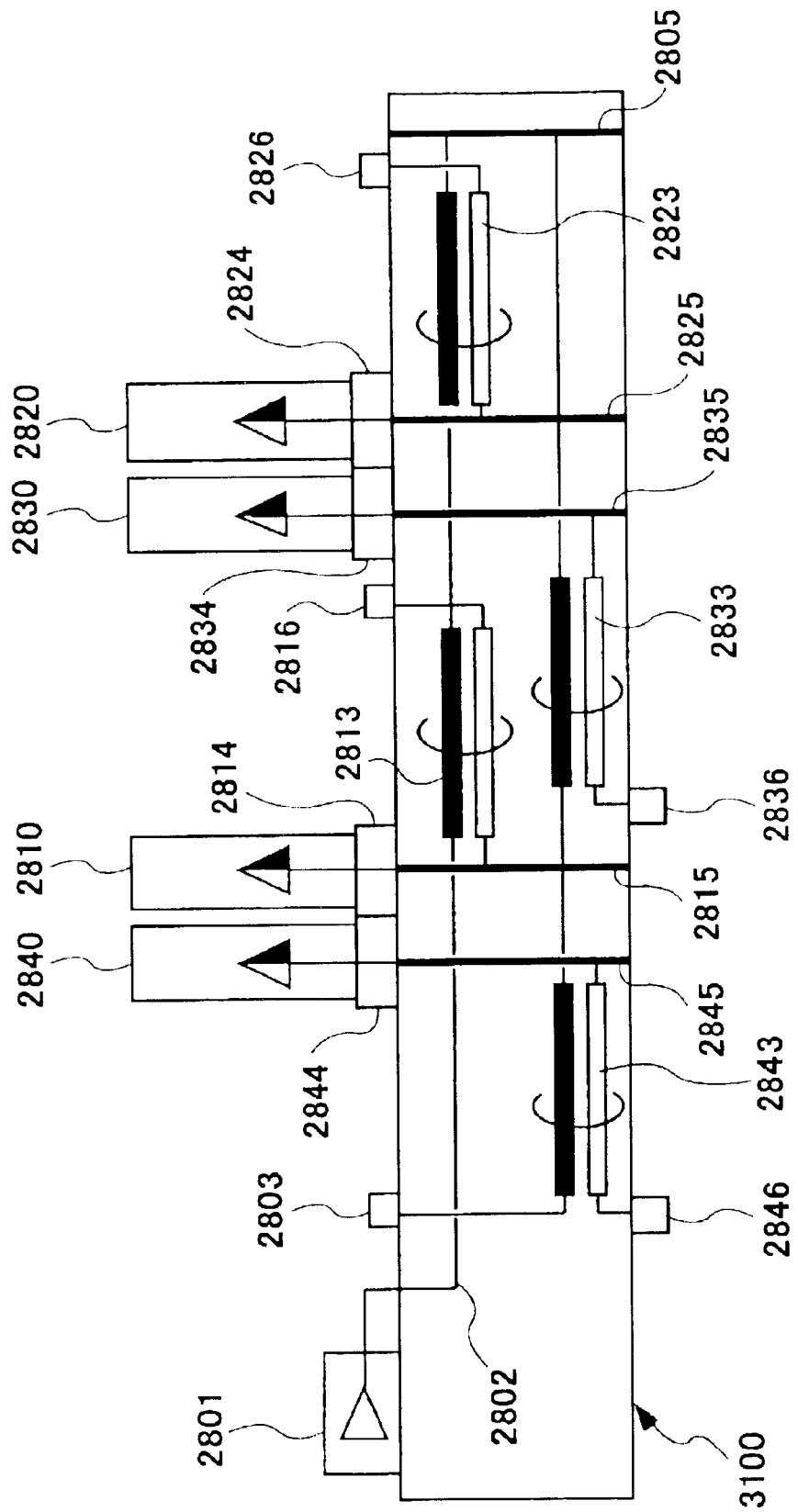
FIG. 31 is an explanatory view illustrating a structure of a printed circuit board designed by a design method of an embodiment according to the present invention.
Figure 33:
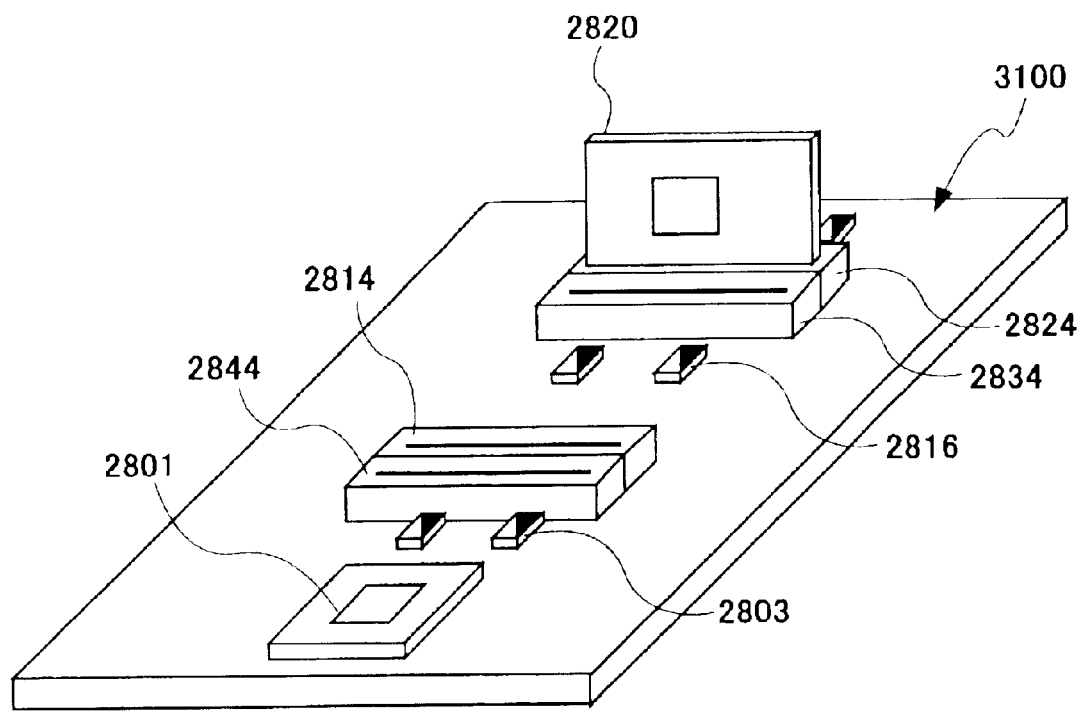
FIG. 33 is a total perspective view of the printed circuit board illustrated in FIG. 31.

On the contrary, in this embodiment, when the "Deformation Allowed/Not Allowed" of the coupler information 301 illustrated in FIG. 3 is set to "Not Allowed" and when the couplers overlap other wirings and other functional components as described above, the wirings and the functional components are moved so as to secure linearity of the coupler. Accordingly, the printed circuit board 3100 as shown in FIG. 31 and FIG. 33 can be obtained.

Also in this printed circuit board 3100, similarly to the printed circuit board 2900 manufactured based on the prior art, the driver 2801, the first to fourth receivers 2810, 2820, 2830 and 2840, the driver termination resistor 2803, the first receiver termination resistor 2816 and the second receiver termination resistor 2826 are provided on the upper plane of the circuit board body, and the third receiver termination resistor 2836 and the fourth receiver termination resistor 2846 are provided on the rear plane of the circuit board body. However, in this printed circuit board 3100, as a result of moving the through holes to keep the linearity of the coupler at the layout diagram design stage, the arrangement order of the receivers varies, and further the mutual intervals between the receivers and the mutual intervals between the termination resistors become unequal to each other.

To be concrete, in the conventional printed circuit board 2900, with respect to the receivers, the first receiver 2810 closest to the driver, the fourth receiver 2840, the second receiver 2820, and the third receiver 2830 are arranged in this order. In the printed circuit board 3100 of this embodiment, the fourth receiver 2840 closest to the driver, the first receiver 2810, the third receiver 2830 and the second receiver 2820 are arranged in this order. Moreover, though the intervals between the receivers adjacent to each other are equal as described above in the conventional printed circuit board 2900, the interval between the fourth receiver 2840 and the first receiver 2810 and the interval between the third receiver 2830 and the second receiver 2820 are equal in the printed circuit board 3100 of this embodiment However, the interval between the fourth receiver 2840 and the first receiver 2810 and the interval between the first receiver 2810 and the third receiver 2830 are not equal.

Figure 32:
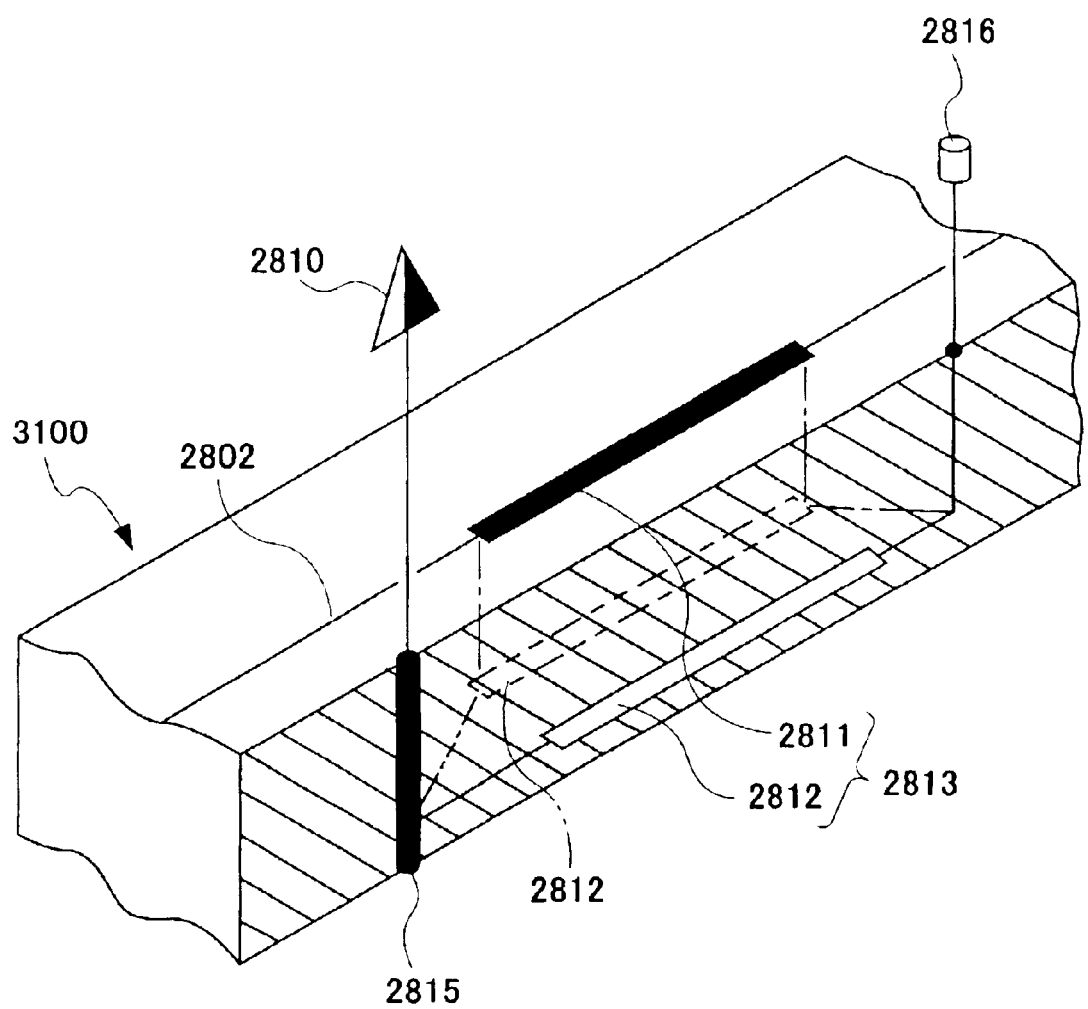
FIG. 32 is a principal part exploded perspective view of the printed circuit board illustrated in FIG. 31.

In this embodiment, as a result of the foregoing layout, the linearity of all couplers is secured as described above. To be concrete, as shown in FIG. 32, any of the main line 2811 and stub line 2812, which constitute the first coupler 2313, is a straight line so that the through hole does not disturb the main line 2811 and stub line 2812 of the first coupler 2813.

Accordingly, in this embodiment, it is possible to manufacture the coupler capable of achieving the desired crosstalk signal.

Figure 34:
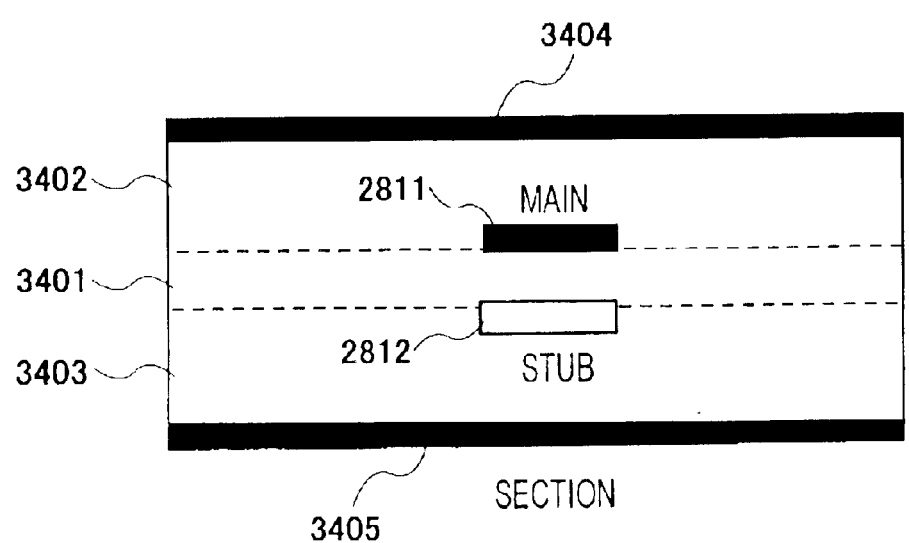
FIG. 34 is a section view of a printed circuit board obtained by modifying a part of the printed circuit board illustrated in FIG. 31.
Figure 35:
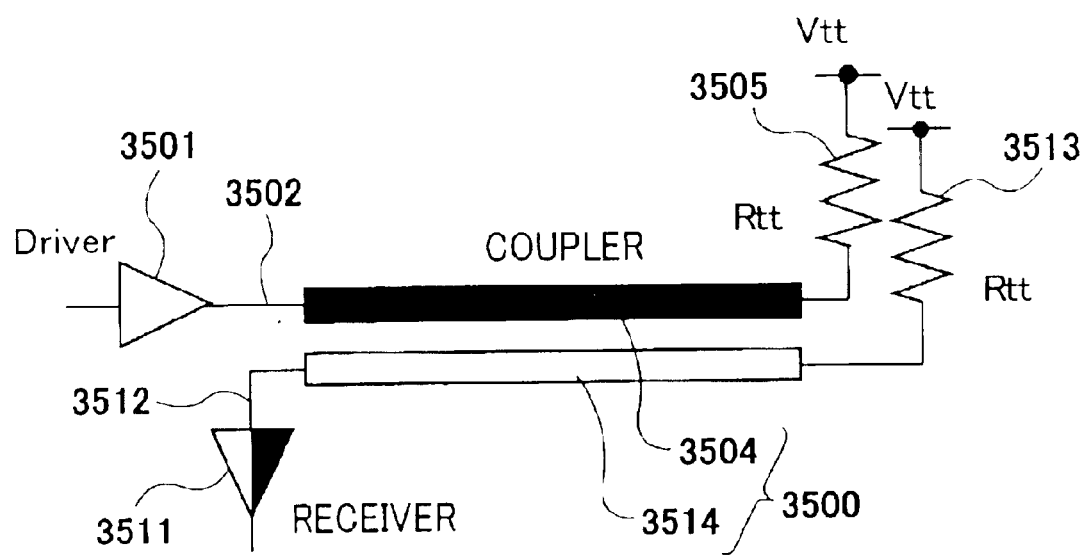
FIG. 35 is an explanatory view illustrating a constitution of a coupler.
Figure 36:
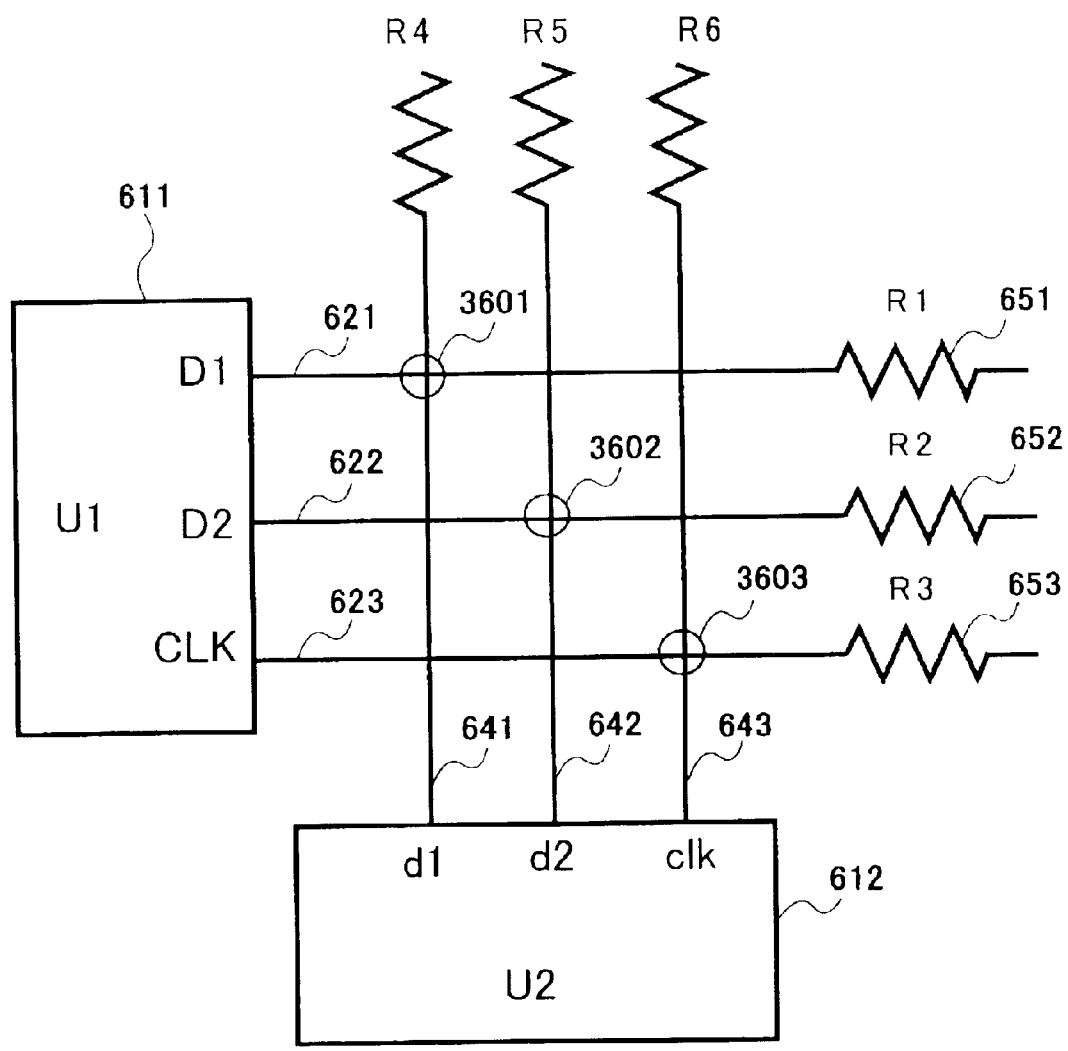
FIG. 36 is a conventional circuit diagram of a circuit including couplers.
Figure 37:
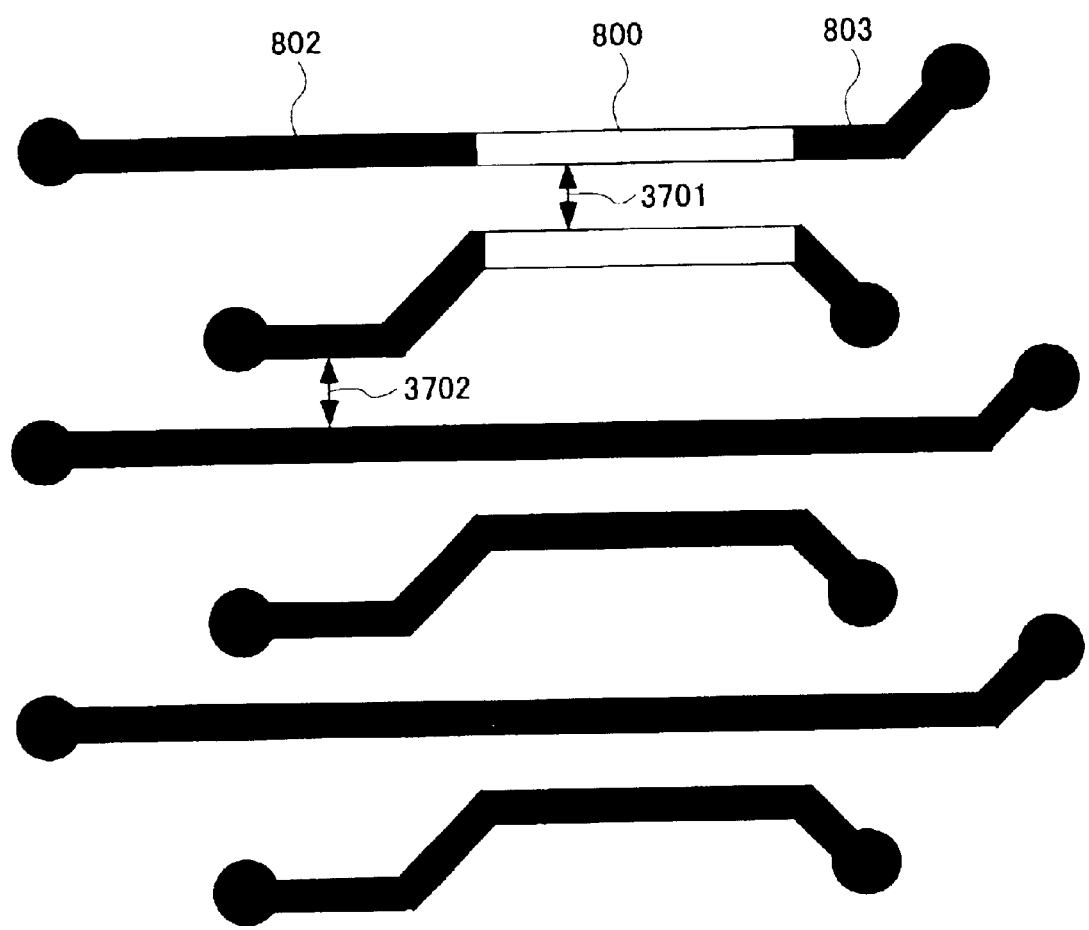
FIG. 37 is a layout diagram around the coupler in the circuit diagram of FIG. 36.

The above descriptions were made for the coupler constitution in the case where the "Deformation Allowed/Not Allowed" of the coupler information 301 is set to "Not Allowed". Moreover, as the coupler information 301, "Existence or Nonexistence of Vertical Overlap in Wiring" can be added, so that it is made possible to set "Existence or Nonexistence of Vertical Overlap in Wiring" to "Existence". Then, layout may be done so that the stub line 2812 and the main line 2811 overlap vertically as shown in FIG. 34. In this case, as illustrated by the chain double-dashed lines in FIG. 32, the receiver signal line from the first through hole 2815 is once extended toward the driver signal line 2802 so as to pass just below the driver signal line 2802, and the stub line 2812 is formed there. The receiver signal line from the end of the stub line 2812 is again extended in a direction so as to be apart from the driver signal line 2802, and then risen from a proper position. Finally, the receiver termination resistor 2816 may be provided at the uppermost of the receiver signal line.

In the case of the foregoing layout, as shown in FIG. 34, the main line 2811 and the stub line 2812 are adhered to one plane of the base member 3401 and the other plane thereof at their proper positions opposite to each other with adhesives 3402 and 3403, respectively. The power source wiring layers 3404 and 3405 are adhered to the outsides of the adhesives 3402 and 3403. Thus, the main line 2811 and the stub line 2812 are provided on the same base member 3401. Accordingly, it is possible to suppress a deviation of wiring positions due to manufacturing variations to a minimum. Moreover, the main line 2811 and the stub line 2812 are arranged so as to overlap with each other in the vertical direction, whereby a crosstalk voltage can be easily increased, resulting in an increase in a data transfer speed.

According to the present invention relating to the design support of the circuit diagram, since in the circuit diagram, the directional coupler is not drawn as a mere wiring but as a component symbol, the wiring forming the directional coupler can be easily found out from the circuit diagram, and moreover the correlation between the circuit diagram and the layout diagram can be easily recognized. As a result, the number of preparation steps of the layout diagram based on this circuit diagram can be reduced.

Furthermore, according to the present invention relating to the design support of the layout diagram, the two wirings forming the directional coupler are treated as one component, the interval check for the two wirings is not performed at the time of the interval check, but the check of the interval between the directional coupler as one component and each of other wirings is performed. Accordingly, the interval check is performed effectively with a high precision, and the number of the preparation steps of the layout diagram can be reduced.

According to the present invention relating to the circuit board designed by the design support of the layout diagram, since the directional coupler is formed to be a straight line shape, the skew of the crosstalk signal can be suppressed, and the data transfer speed can be increased.

What is claimed is:

1. A design support apparatus for a circuit diagram which illustrates connections among components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, comprising:

symbol storage means for storing various symbols, each being previously determined for corresponding one of various components including the directional coupler;

symbol arrangement means for accepting a symbol to be arranged among various symbols stored in the symbol storage means and for accepting an arrangement position of the symbol to arrange the symbol at the arrangement position accepted;

circuit diagram information storage means for storing the symbol arranged by the symbol arrangement means and the arrangement position of the symbol;

attribute information acceptance means for accepting coupler attribute information including at least a parallel signal line length of the directional coupler and a signal line interval thereof; and attribute information storage means for storing the coupler attribute information accepted by the attribute information acceptance means in relation to a symbol of the directional coupler, which is arranged or to be arranged by the symbol arrangement means.

2. A design support apparatus for a circuit diagram which illustrates connections among components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, comprising:

symbol storage means for storing various symbols, each being previously determined for corresponding one of various components including the directional coupler;

symbol arrangement means for accepting a symbol to be arranged among various symbols stored in the symbol storage means and for accepting an arrangement position of the symbol to arrange the symbol at the arrangement position accepted;

circuit diagram information storage means for storing the symbol arranged by the symbol arrangement means and the arrangement position of the symbol;

circuit simulator means for virtually executing a state when the circuit is operated; and signal line length setting means for comparing an amplitude of the crosstalk signal of the directional coupler obtained by a simulation by the circuit simulator means with an amplitude range previously determined, and for repeating setting of a new parallel signal line length of the directional coupler an the simulation by the circuit simulator means with the set parallel signal line length when the amplitude of the crosstalk signal obtained by the simulation is outside the amplitude range previously determined, until the amplitude of the crosstalk signal obtained by the simulation falls within the amplitude range previously determined.

3. A design support tool for allowing a computer to execute a design support of a circuit diagram illustrating connections of various components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, the tool having symbol data stored in a first storage area of the computer, the symbol data being related to a shape of a symbol previously determined for each of the components including the directional coupler, and the tool allowing the computer to execute symbol arrangement procedures for accepting symbols to be arranged among various symbol data stored in the first storage area as well as for accepting arrangement positions of the symbols, and for arranging the symbols at the arrangement positions accepted;

circuit diagram information storage procedures for storing the symbols arranged in the symbol arrangement procedures and the arrangement positions of the symbols in a second storage area of the computer, the tool further allowing the computer to execute attribute information acceptance procedures for accepting coupler attribute information including at least a parallel signal line length of the directional coupler and a signal line interval thereof; and attribute information storage procedures for storing the coupler attribute information accepted in the attribute information acceptance procedures in a third storage area of the computer in relation to a symbol of the directional coupler, which is arranged or to be arranged in the symbol arrangement procedures.

4. A design support tool for allowing a computer to execute a design support of a circuit diagram illustrating connections of various components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, the tool having symbol data stored in a first storage area of the computer, the symbol data being related to a shape of a symbol previously determined for each of the components including the directional coupler, and the tool allowing the computer the execute symbol arrangement procedures for accepting symbols to be arranged among various symbol data stored in the first storage area as well as for accepting arrangement positions of the symbols, and for arranging the symbols at the arrangement positions accepted;

circuit diagram information storage procedures for storing the symbols arranged in the symbol arrangement procedures and the arrangement positions of the symbols in a second storage area of the computer, wherein the symbol of the directional coupler has a terminal for a wiring coupled to the directional coupler, the tool allows the computer to execute wiring arrangement procedures for arranging the wiring in the terminal in the symbol of the directional coupler arranged in the symbol arrangement procedures so as to connect the terminal as one of a start point and an end point of the wiring upon acceptance of an instruction of the wiring, and an arrangement position of the wiring arranged in the wiring arrangement procedures is stored in the circuit diagram information storage procedures.

5. A design support tool for allowing a computer to execute a design support of a circuit diagram illustrating connections of various components in a circuit including a directional coupler in which first and second signal lines are arranged partially in parallel with each other, the first signal line being coupled to a driver for outputting a signal and the second signal line being coupled to a receiver for receiving a crosstalk signal based on the signal from the driver, the tool having symbol data stored in a first storage area of the computer, the symbol data being related to a shape of a symbol previously determined for each of the components including the directional coupler, and the tool allowing the computer to execute symbol arrangement procedures for accepting symbols to be arranged among various symbol data stored in the first storage area as well as for accepting arrangement positions of the symbols, and for arranging the symbols at the arrangement positions accepted;

circuit diagram information storage procedures for storing the symbols arranged in the symbol arrangement procedures and the arrangement positions of the symbols in a second storage area of the computer, wherein the tool allows the computer to execute circuit simulator procedures for virtually executing a state when the circuit is operated; and signal line length setting procedures for comparing an amplitude of the crosstalk signal of the directional coupler obtained by a simulation signal of the directional procedures with an amplitude range previously determined, and for repeating setting of a new parallel signal line length of the directional coupler and the simulation in the circuit simulator procedures with the set parallel signal line length when the amplitude of the crosstalk signal obtained by the simulation is outside the amplitude range previously determined, until the amplitude of the crosstalk signal obtained by the simulation falls whitin the amplitude range previously determined.

\* \* \* \* \*